(12) United States Patent
Marutani

(10) Patent No.: US 7,750,747 B2
(45) Date of Patent: Jul. 6, 2010

(54) CLOCK SELECTION CIRCUIT AND SYNTHESIZER

(75) Inventor: Masazumi Marutani, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 227 days.

(21) Appl. No.: 11/905,223

(22) Filed: Sep. 28, 2007

(65) Prior Publication Data
US 2008/0042760 A1    Feb. 21, 2008

Related U.S. Application Data

(63) Continuation of application No. PCT/JP2005/006355, filed on Mar. 31, 2005.

(51) Int. Cl.
*H03L 7/085* (2006.01)
(52) U.S. Cl. .............. 331/179; 331/2; 331/10; 331/11; 331/49; 331/56
(58) Field of Classification Search .......... 331/2, 331/10, 11, 16, 17, 20, 46, 49, 56, 179; 327/147, 327/156; 375/375, 376
See application file for complete search history.

(56) References Cited
U.S. PATENT DOCUMENTS
| | | | | |
|---|---|---|---|---|
| 6,563,387 B2* | 5/2003 | Hirano et al. | ................. | 331/11 |
| 6,597,249 B2* | 7/2003 | Chien et al. | ............. | 331/177 R |
| 6,661,291 B2* | 12/2003 | Jovenin | ...................... | 331/1 A |
| 6,707,342 B1 | 3/2004 | Zachan et al. | | |
| 2002/0105387 A1 | 8/2002 | Jovenin | | |

FOREIGN PATENT DOCUMENTS

| | | |
|---|---|---|
| JP | 9-284681 A | 10/1997 |
| JP | 2001-339301 A | 12/2001 |
| WO | WO-2005/093956 | 10/2005 |

OTHER PUBLICATIONS

Supplementary European Search Report for PCT/JP2005006355 dated Oct. 19, 2009.

* cited by examiner

*Primary Examiner*—Robert Pascal
*Assistant Examiner*—Levi Gannon
(74) *Attorney, Agent, or Firm*—Fujitsu Patent Center

(57) ABSTRACT

A clock selection circuit and synthesizer that is capable of selecting an optimum clock signal from among a plurality of clock signals in a short time. A reference-clock counter counts clock pulses in an inputted reference clock signal (REF). A clock counter counts clock pulses in one of the plurality of clock signals which is selected by a selection unit and frequency-divided by a frequency divider. An instruction-signal output unit outputs a plurality of comparison-instruction signals during an interval in which a difference occurs between the counts of two of the plurality of clock signals having the closest frequencies. A comparison unit compares the count of the reference-clock counter and the count of the clock counter. The selection unit selects a clock signal by a binary search according to the result of the comparison.

12 Claims, 17 Drawing Sheets

| | |
|---|---|
| 1 | ±S1 |
| 2 | ±S2 |
| 3 | ±S3 |
| ⋮ | ⋮ |
| p | ±Sp |

| Possible True Value When Difference is Two ||| Determination Timing (Count of Slow Clock) |
|---|---|---|---|
| M=1 | M=2 | M=3 | |
| 55.6 | 100.0 | 300.0 | 1(C1) |
| 15.2 | 29.4 | 51.7 | 4(C2) |
| 4.8 | 9.4 | 14.9 | 13(C3) |
| 1.6 | 3.1 | 4.7 | 40(C4) |
| 0.5 | 1.0 | 1.4 | 130(C5) |

Unit [KHz]

FIG. 9

| Determination Phase | Amount of Change after Determination | Determination Time | Partway Determination | Determination of Completion of Selection |
|---|---|---|---|---|
| 1 | ±4 | Dynamic tf/n~tf | Execution | Possible |
| 2 | ±2 | Dynamic tf/n~tf | Execution | Possible |
| 3 | ±1 | Dynamic tf/n~tf | Execution | Execution |

52

FIG. 11

CLOCK SELECTION CIRCUIT AND SYNTHESIZER

This application is a continuing application, filed under 35 U.S.C. §111(a), of International Application PCT/JP2005/006355, filed Mar. 31, 2005.

BACKGROUND

1. Field

The embodiment relates to a clock selection circuit and a synthesizer.

2. Description of the Related Art

The recent improvement in the performance and the packing densities in the integrated electronic circuits requires each chip to exhibit higher performance. Even the synthesizers which supply to various circuits clock signals being necessary for operation of the circuits and having frequencies necessary for the operation are required to concurrently satisfy a number of requirements such as bandwidth broadening, narrowing of frequency gaps, improvement of noise characteristics, and the like.

In a synthesizer which has been proposed in the above circumstances, a plurality of clock signals are prepared in a circuit, and one of the clock signals having a desired frequency and desired noise characteristics is selected and outputted. (See Japanese Unexamined Patent Publication No. 2001-339301).

FIG. 13 is a block diagram illustrating a conventional synthesizer. As illustrated in FIG. 13, the synthesizer 100 comprises a phase comparator 101, an LPF (low-pass filter) 102, a voltage-controlled-oscillator (VCO) group 103, a frequency divider 104, and a clock selection circuit 105. Hereinafter, the voltage controlled oscillator is referred to as the VCO, and the voltage-controlled-oscillator group is referred to as the VCO group.

A reference clock signal REF outputted from, for example, a quartz oscillator and a frequency-divided clock signal outputted from the frequency divider 104 are inputted into the phase comparator 101. The phase comparator 101 detects a phase difference between the reference clock signal REF and a frequency-divided clock signal, and outputs a phase-difference signal. Only a low-frequency component of the phase-difference signal passes through the LPF 102, so that the LPF 102 outputs to the VCO group 103 a voltage corresponding to the phase difference between the reference clock signal REF and the frequency-divided clock signal.

The VCO group 103 contains a plurality of VCOs (VCO1 to VCO15). Generally, the number of the VCOs is designed to have 2^N−1, and 15 in this example. The clock selection circuit 105 selects one of the VCOs in the VCO group 103 so that the selected VCO outputs a clock signal CLK having a frequency corresponding to the voltage outputted from the LPF 102. The clock signal CLK is supplied to the frequency divider 104 and the outside of the synthesizer 100. The frequency divider 104 divides the frequency of the clock signal CLK. The frequency-division ratio can be changed in accordance with an external instruction.

The reference clock signal REF and the frequency-divided clock signal CLK are inputted into the clock selection circuit 105. The clock selection circuit 105 selects one of the VCOs in the VCO group 103 so that the frequency-divided clock signal CLK outputted from the frequency divider 104 has the most appropriate frequency. The clock selection circuit 105 selects a VCO which minimizes the frequency difference between the reference clock signal REF and the frequency-divided clock signal, according to the frequency-division ratio of the frequency divider 104.

Next, the sequence of selecting a VCO by the clock selection circuit 105 is explained in detail below. FIG. 14 is a diagram presented for explaining the sequence of selecting a VCO by the clock selection circuit 105. The oblique lines in FIG. 14 indicate the characteristics of the VCO1 to VCO15 in the VCO group 103. The oblique line at the bottom indicates the characteristic of the VCO1, and the oblique line at the top indicates the characteristic of the VCO15. The VCO which is to be selected for the currently set frequency-division ratio is indicated as "Target." When the VCO indicated as "Target" is selected, the frequency of the frequency-divided clock signal outputted from the frequency divider 104 becomes closest to the frequency of the reference clock signal REF. The clock selection circuit 105 selects one of the VCO1 to VCO15 according to a code. The value of the code is proportional to the number of the selected one of the VCO1 to VCO15.

The clock selection circuit 105 first selects the VCO8 in the center of the array of VCO1 to VCO15 according to the code "8" as indicated by the blank circle in FIG. 14, and it is determined whether the frequency of the clock signal outputted from the target VCO (corresponding to the reference clock signal REF) is higher or lower than the frequency of the clock signal outputted from the selected VCO8 (corresponding to the frequency of the frequency-divided clock signal outputted from the frequency divider 104). Then, the code is changed by ±4 according to the determination result. Thereafter, the selected VCO is changed in a similar manner by repeating the determination whether the frequency of the clock signal outputted from the target VCO is higher or lower than the frequency of the clock signal outputted from the selected VCO, and changing the code by ±2 and then ±1 until the selected VCO reaches the target VCO. That is, a binary search is performed.

In the example of FIG. 14, the frequency of the target clock signal is higher than the frequency of the clock signal outputted from the selected VCO8. Therefore, the clock selection circuit 105 changes the code by +4, so that the VCO12 is selected. At this time, the frequency of the target clock signal is still higher than the frequency of the clock signal outputted from the selected VCO12. Thus, the clock selection circuit 105 changes the code by +2, so that the VCO14 is selected. At this time, the frequency of the target clock signal is lower than the frequency of the clock of the VCO8. Therefore, the clock selection circuit 105 changes the code by −1, so that the VCO13 is selected as the target VCO.

Next, details of the clock selection circuit 105 are explained below. FIG. 15 is a circuit diagram of a conventional clock selection circuit. As illustrated in FIG. 15, the clock selection circuit 105 comprises counters 111 and 112, a difference calculation unit 113, a comparison unit 114, a count-error-margin unit 115, a phase-information addition unit 116, a phase information unit 117, a timer counter 118, a timing TB (table) 119, a phase change unit 120, a reset-signal output unit 121, a clock-selection-signal output unit 122, a shift TB 123, an end-of-selection determination unit 124, and an optimum-clock-information output unit 125. In addition, the frequency divider 104, the VCO group 103, and the reference clock signal REF, which are indicated in FIG. 13, are also indicated in FIG. 15.

The counter 111 counts clock pulses in the frequency-divided clock signal outputted from the frequency divider 104. The counter 112 counts clock pulses in the reference clock signal REF. The difference calculation unit 113 obtains the difference between the count of clock pulses in the frequency-divided clock signal obtained by the counter 111 and the count of clock pulses in the reference clock signal REF obtained by the counter 112.

When the comparison unit 114 receives a comparison-instruction signal from the timer counter 118, the comparison unit 114 compares the count of clock pulses in the frequency-divided clock signal (the frequency of the frequency-divided clock signal) and the count of clock pulses in the reference clock signal REF (the frequency of the reference clock signal REF), and determines whether or not the counts are equal, or which count is greater, on the basis of the difference value outputted from the difference calculation unit 113. When the difference value is within a range indicated by the count-error-margin unit 115, the comparison unit 114 determines that the counts obtained by the counters 111 and 112 are equal. Since the reference clock signal REF and the frequency-divided clock signal are asynchronous, the timings of rising and falling of the reference clock signal REF and the frequency-divided clock signal can drift, so that errors which can occur in the counts should be considered.

When the comparison unit 114 outputs a comparison result, the phase-information addition unit 116 increments by one the phase information held by the phase information unit 117. The phase information indicates a layer in which a comparison of the frequency-divided clock signal and the reference clock signal REF is currently made during the sequence of the binary search, and the number of times the VCO has been changed. The phase information indicates the number "0" when the code is "8," the phase information indicates the number "1" when the code is changed by "±4," the phase information indicates the number "2" when the code is changed by "±2," the phase information indicates the number "3" when the code is changed by "±1."

When the reset-signal output unit 121 outputs a reset signal, the timer counter 118 counts from zero the clock pulses in the reference clock signal REF. When the count reaches a value indicated by the timing TB 119, the timer counter 118 outputs to the comparison unit 114 a comparison-instruction signal.

The timing TB 119 stores the values of the count corresponding to each phase. For example, the timing TB 119 stores the count value W for the phase "0," the count value W for the phase "1," . . . , the count value W for the phase "n" so that the comparison-instruction signal is outputted at regular intervals. The time intervals are determined so that a difference occurs between the counts of clock pulses outputted from VCOs having adjacent frequencies in each interval, i.e., a difference occurs between the counts obtained by the counters 111 and 112 in an interval even when a VCO next to the target VCO is selected (for example, after one or more selections are made at one or more phases).

When the phase information held by the phase information unit 117 is updated, the phase change unit 120 outputs a signal indicating the update to the reset-signal output unit 121, the clock-selection-signal output unit 122, and the end-of-selection determination unit 124. The reset-signal output unit 121 outputs a reset signal to the counters 111 and 112 and the timer counter 118 on receipt of the signal from the phase change unit 120, so that the counts of the counters 111 and 112 and the timer counter 118 are reset to zero. When the clock-selection-signal output unit 122 receives the above signal from the phase change unit 120, the clock-selection-signal output unit 122 refers to the shift TB 123, and acquires the amount of a code to be changed, on the basis of the phase information and the result of the comparison made by the comparison unit 114. The shift TB 123 indicates the amounts of change in the code corresponding to the phase information.

For example, the amount of change in the code stored in the shift TB 123 is ±4 when the phase is "1," ±2 when the phase is "2," and ±1 when the phase is "3."

Since the initial value of the phase information is "0," the clock-selection-signal output unit 122 outputs the value "8" of the code so that the VCO8 in the center of the VCO group 103 is selected. Therefore, when the comparison result is outputted from the comparison unit 114, the phase information becomes "1," and the clock-selection-signal output unit 122 changes the code by "+4" or "−4" according to the comparison result and the phase information. Thereafter, the code is changed so that the target VCO is finally selected.

In order to determine whether or not the sequence of selecting a VCO is completed, the end-of-selection determination unit 124 determines whether or not the phase information held by the phase information unit 117 is the final value of the phase information plus one. For example, in the case where the number of the VCOs is 15, the sequence of selecting a VCO is completed when the phase information is "3." Therefore, when the phase information is "4," the end-of-selection determination unit 124 determines that the sequence of selecting a VCO is completed. When the optimum-clock-information output unit 125 receives the determination by the end-of-selection determination unit 124, the optimum-clock-information output unit 125 externally outputs a signal indicating the completion of the sequence of selecting an optimum VCO, although the output of this information from the clock selection circuit 105 is not shown in FIG. 13.

Next, the operations of the clock selection circuit 105 of FIG. 15 are explained with reference to a flowchart. FIG. 16 is a flowchart indicating the operations of the clock selection circuit of FIG. 15.

In step S111, the timer counter 118 in the clock selection circuit 105 starts counting. When the count reaches the value corresponding to the phase "1" and being stored in the timing TB 119, the timer counter 118 outputs a comparison-instruction signal to the comparison unit 114. In this example, it is assumed that, at this time, the phase information is "0," and the VCO8 is selected.

When the comparison unit 114 receives the comparison-instruction signal from the timer counter 118, the comparison unit 114 determines whether the frequency of the selected VCO8 (the count of clock pulses outputted from the selected VCO8) is higher or lower than the frequency of the target clock signal (the count of clock pulses in the target clock signal). The phase-information addition unit 116 increments by one the phase information "0" held by the phase information unit 117.

In step S112, when the comparison unit 114 determines that the frequency of the selected VCO is lower than the frequency of the target VCO, the operation of the clock-selection-signal output unit 122 goes to step S113. When the comparison unit 114 determines that the frequency of the selected VCO is higher than the frequency of the target VCO, the operation of the clock-selection-signal output unit 122 goes to step S114.

In step S113, the clock-selection-signal output unit 122 acquires from the shift TB 123 the amount of change in the code on the basis of the phase information held in the phase information unit 117 and the result of the comparison made by the comparison unit 114. Since the phase information is "1," and the comparison unit 114 determines that the frequency of the selected VCO is lower than the frequency of the target VCO, the code is changed by "+4."

In step S114, the clock-selection-signal output unit 122 acquires from the shift TB 123 the amount of change in the code on the basis of the phase information held in the phase information unit 117 and the result of the comparison made by the comparison unit 114. Since the phase information is "1," and the comparison unit 114 determines that the frequency of the selected VCO is higher than the frequency of the target VCO, the code is changed by "−4."

In step S115, when the count of the timer counter 118 in the clock selection circuit 105 reaches the value corresponding to the phase "2" and being stored in the timing TB 119, the timer counter 118 outputs a comparison-instruction signal to the comparison unit 114. At this time, the phase of the clock selection circuit 105 is "1."

When the comparison unit 114 receives the comparison-instruction signal from the timer counter 118, the comparison unit 114 determines whether the frequency of the selected VCO (the count of clock pulses outputted from the selected VCO) is higher or lower than the frequency of the target clock signal (the count of clock pulses in the target clock signal). The phase-information addition unit 116 increments by one the phase information "1" held by the phase information unit 117.

In step S116, when the comparison unit 114 determines that the frequency of the selected VCO is lower than the frequency of the target VCO, the operation of the clock-selection-signal output unit 122 goes to step S117. When the comparison unit 114 determines that the frequency of the selected VCO is higher than the frequency of the target VCO, the operation of the clock-selection-signal output unit 122 goes to step S118.

In step S117, the clock-selection-signal output unit 122 acquires from the shift TB 123 the amount of change in the code on the basis of the phase information held in the phase information unit 117 and the result of the comparison made by the comparison unit 114. Since the phase information is "2," and the comparison unit 114 determines that the frequency of the selected VCO is lower than the frequency of the target VCO, the code is changed by "+2."

In step S118, the clock-selection-signal output unit 122 acquires from the shift TB 123 the amount of change in the code on the basis of the phase information held in the phase information unit 117 and the result of the comparison made by the comparison unit 114. Since the phase information is "2," and the comparison unit 114 determines that the frequency of the selected VCO is higher than the frequency of the target VCO, the code is changed by "−2."

In step S119, when the count of the timer counter 118 in the clock selection circuit 105 reaches the value corresponding to the phase "3" and being stored in the timing TB 119, the timer counter 118 outputs a comparison-instruction signal to the comparison unit 114. At this time, the phase of the clock selection circuit 105 is "2."

When the comparison unit 114 receives the comparison-instruction signal from the timer counter 118, the comparison unit 114 determines whether the frequency of the selected VCO (the count of clock pulses outputted from the selected VCO) is higher or lower than the frequency of the target clock signal (the count of clock pulses in the target clock signal). The phase-information addition unit 116 increments by one the phase information "2" held by the phase information unit 117.

In step S120, when the comparison unit 114 determines that the frequency of the selected VCO is lower than the frequency of the target VCO, the operation of the clock-selection-signal output unit 122 goes to step S121. When the comparison unit 114 determines that the frequency of the selected VCO is higher than the frequency of the target VCO, the operation of the clock-selection-signal output unit 122 goes to step S122.

In step S121, the clock-selection-signal output unit 122 acquires from the shift TB 123 the amount of change in the code on the basis of the phase information held in the phase information unit 117 and the result of the comparison made by the comparison unit 114. Since the phase information is "3," and the comparison unit 114 determines that the frequency of the selected VCO is lower than the frequency of the target VCO, the code is changed by "+1."

In step S122, the clock-selection-signal output unit 122 acquires from the shift TB 123 the amount of change in the code on the basis of the phase information held in the phase information unit 117 and the result of the comparison made by the comparison unit 114. Since the phase information is "3," and the comparison unit 114 determines that the frequency of the selected VCO is higher than the frequency of the target VCO, the code is changed by "−1."

In step S123, when the count of the timer counter 118 in the clock selection circuit 105 reaches the value corresponding to the phase "4" and being stored in the timing TB 119, the timer counter 118 outputs a comparison-instruction signal to the comparison unit 114. At this time, the phase of the clock selection circuit 105 is "3."

When the comparison unit 114 receives the comparison-instruction signal from the timer counter 118, the comparison unit 114 determines whether the frequency of the selected VCO (the count of clock pulses outputted from the selected VCO) is higher or lower than the frequency of the target clock signal (the count of clock pulses in the target clock signal). The phase-information addition unit 116 increments by one the phase information "3" held by the phase information unit 117.

Since the phase information is "4,", the end-of-selection determination unit 124 determines that the sequence of selecting a VCO is completed. When the phase information becomes "4," the phase change unit 120 controls the clock-selection-signal output unit 122 so as not to newly select a VCO.

As explained above, the clock selection circuit 105 can select an optimum VCO.

Next, the characteristics of the VCO group 103 of FIG. 13 are explained. The VCO group 103 uses LC-resonance type VCOs because of their superior noise characteristics. In the VCO group 103, the plurality of VCOs are realized (as a plurality of clock sources) by switching among a plurality of capacitors according to the code. However, since the relationship between the frequency and the capacitance is nonlinear, the gaps between the VCOs are not equal as illustrated in FIG. 14.

FIG. 17 is a diagram presented for explaining the characteristics of the VCO group 103. The oblique lines in FIG. 17 indicate the characteristics of the VCO group 103. As indicated in FIG. 17, the gaps between the clock frequencies decrease with the frequencies. The comparison time, which is a time necessary for comparison of a selected VCO and the target VCO, is determined by the minimum frequency gap. When the minimum frequency gap is indicated as fg_min, the comparison time is indicated as 1/fg_min. Since the determination is required to be made N times until the target VCO is selected from among the 2^N−1 VCOs, the time necessary for the sequence of selecting the VCO is N/fg_min.

SUMMARY

The embodiment provides a clock selection circuit for selecting a clock signal from among a plurality of clock signals having different frequencies so that the clock signal has a frequency-divided frequency equal to a frequency of a reference clock signal, the clock selection circuit including a reference-clock counter which counts clock pulses in the reference clock signal and obtains a first count, a clock counter which counts clock pulses in a frequency-divided clock signal which is produced by selecting and frequency-dividing a first one of the plurality of clock signals and obtains a second count, an instruction-signal output unit which outputs a plurality of comparison-instruction signals during an interval in which a difference occurs between a count of clock pulses in a second one of the plurality of clock signals having a second frequency and a count of clock pulses in a third one of the plurality of clock signals having a third frequency, where the second frequency and the third frequency are closest among the different frequencies, a comparison unit which makes a first comparison of the first count and the second count according to the comparison instruction signal, and a selection unit which makes a selection of the clock signal by a binary search according to a result of the first comparison.

BRIEF DESCRIPTION OF THE DRAWINGS

FIG. 5 is a diagram illustrating an example of a data structure of a shift TB.

FIG. 9 is a diagram illustrating a table presented for explaining a manner of determining count values.

FIG. 11 is a diagram presented for explaining a manner of determination.

DETAILED DESCRIPTION OF THE EMBODIMENTS

Hereinbelow, the principle of the embodiment is explained in detail with reference to a drawing.

Figure 1:
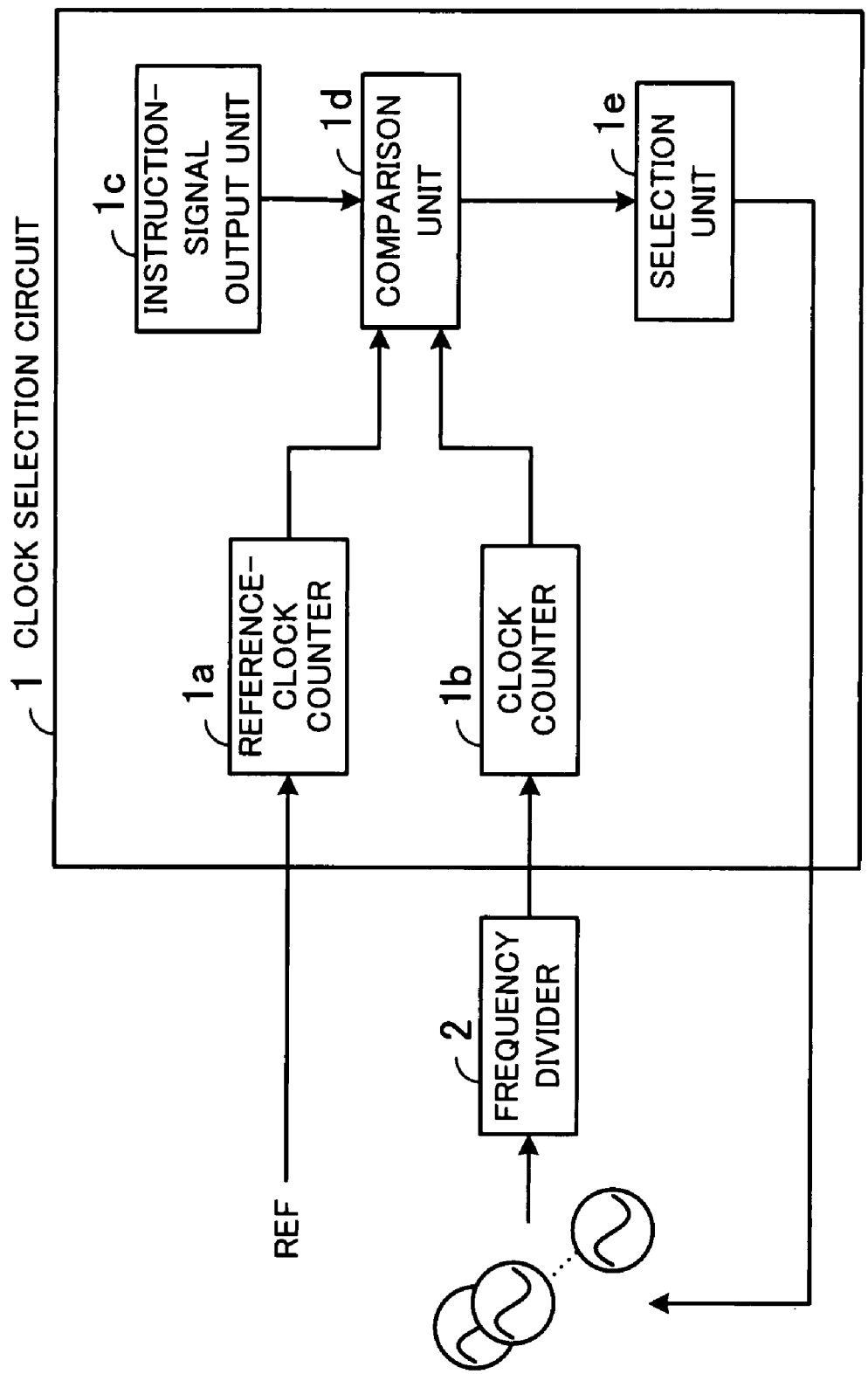
FIG. 1 is a diagram illustrating an outline of a clock selection circuit.

FIG. 1 is a diagram illustrating an outline of a clock selection circuit. The clock selection circuit 1 comprises a reference-clock counter $1a$, a clock counter $1b$, an instruction-signal output unit $1c$, a comparison unit $1d$, and a selection unit $1e$. The clock selection circuit 1 selects one of a plurality of clock signals having different frequencies so that the one of a plurality of clock signals has a frequency-divided frequency identical to the frequency of a reference clock signal REF.

The reference-clock counter $1a$ counts clock pulses in the reference clock signal REF. The clock counter $1b$ counts clock pulses in a clock signal which is produced by selecting one of the plurality of clock signals by the selection unit $1e$ and frequency-dividing the selected clock signal by a frequency divider 2. The instruction-signal output unit $1c$ outputs a plurality of comparison-instruction signals during an interval in which a difference between the counts of two clock signals having the closest frequencies occurs. The comparison unit $1d$ compares the counts obtained by the reference-clock counter $1a$ and the clock counter $1b$ on receipt of each comparison-instruction signal. The selection unit $1e$ selects a clock signal by a binary search according to the result of the comparison made by the comparison unit $1d$.

As described above, a plurality of comparison-instruction signals are outputted during an interval in which a difference between the counts of the two clock signals having the closest frequencies occurs, and the count of the reference clock signal and the count of the selected clock signal are compared on receipt of each comparison-instruction signal. Therefore, when a difference between the count of the reference clock signal and the count of the selected clock signal occurs during the above interval, the next clock signal can be immediately selected, so that it is possible to select an optimum clock signal from among the plurality of clock signals in a short time.

Figure 2:
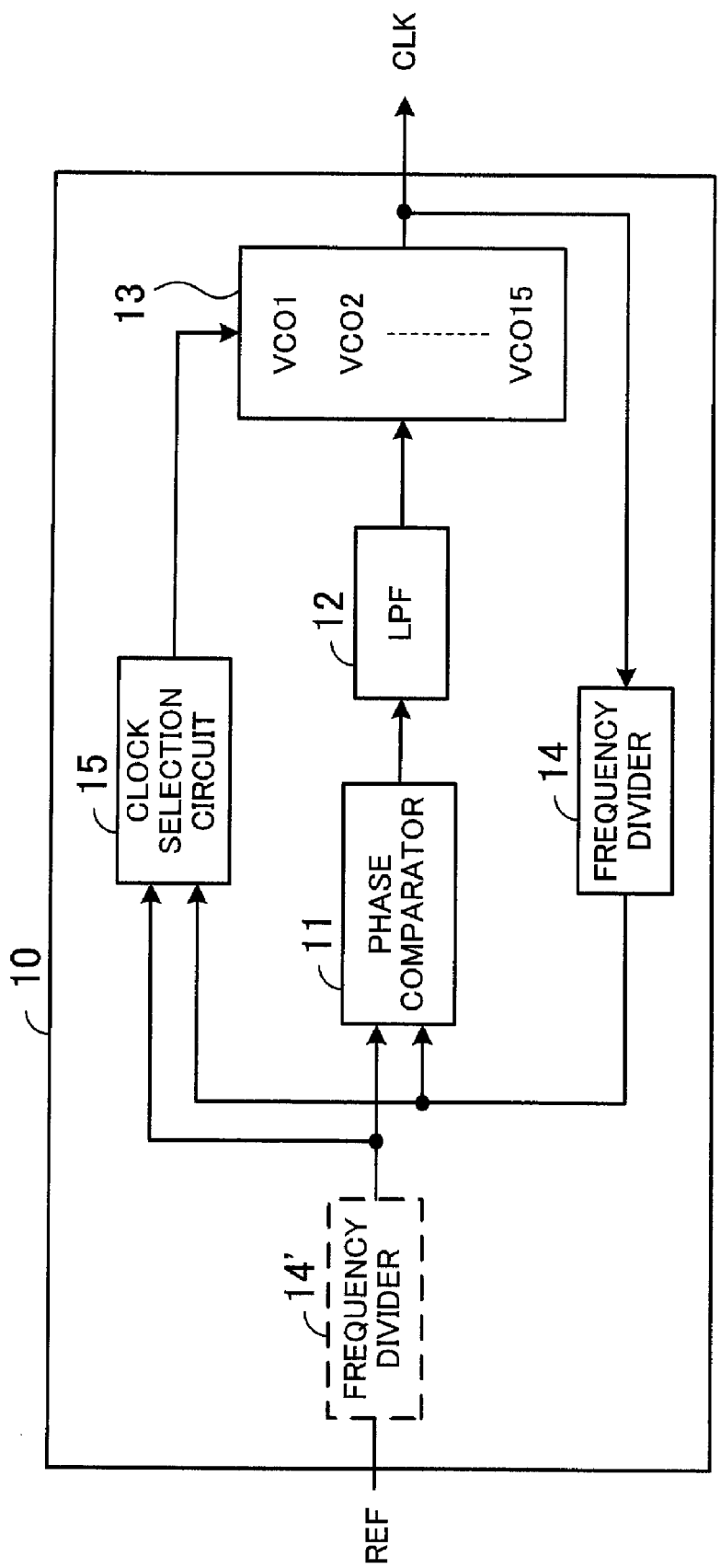
FIG. 2 is a block diagram of a synthesizer in which the clock selection circuit is used.

Next, an embodiment is explained in detail with reference to drawings. FIG. 2 is a block diagram of a synthesizer in which the clock selection circuit is used. As illustrated in FIG. 2, the synthesizer 10 comprises a phase comparator 11, an LPF 12, a VCO group 13, a frequency divider 14, and a clock selection circuit 15.

A reference clock signal REF and a frequency-divided clock signal are inputted into the phase comparator 11. The reference clock signal REF is outputted from, for example, a quartz oscillator, and the frequency-divided clock signal is outputted from the frequency divider 14. The phase comparator 11 detects the phase difference between the reference clock signal REF and the frequency-divided clock signal, and outputs a phase-difference signal. The LPF 12 lets through only a low-frequency component of the phase-difference signal outputted from the phase comparator 11, and outputs a voltage corresponding to the phase difference to the VCO group 13.

The VCO group 13 contains a plurality of VCOs, which are respectively denoted by VCO1 to VCO15. Generally, the number of the VCOs is $2^N-1$, and 15 in this example. A VCO in the VCO group 13 is selected by the clock selection circuit 15, and the selected VCO outputs a clock signal CLK having a frequency corresponding to the voltage outputted from the LPF 12. The clock signal CLK is supplied to the frequency divider 14 and the outside of the synthesizer 10. The frequency divider 14 divides the frequency of the clock signal CLK. The frequency-division ratio in the frequency divider 14 can be changed in accordance with an external instruction. The frequency divider 14 may be arranged in a stage immediately following the VCO group 13 (as indicated by the solid-line box 14 in FIG. 2) or on the reference-clock side (as indicated by the broken-line box 14' in FIG. 2) according to the purpose.

The reference clock signal REF and the frequency-divided clock signal are inputted into the clock selection circuit 15. The clock selection circuit 15 selects from the VCO group 13 such a VCO that the frequency divider 14 outputs a frequency-divided clock signal having an optimum frequency.

That is, the clock selection circuit 15 selects a VCO which minimizes the difference in the frequency between the reference clock signal and the frequency-divided clock signal according to the frequency-division ratio in the frequency divider 14. In the case where the frequency divider 14 is arranged on the reference-clock side, the clock selection circuit 15 selects a VCO which minimizes the difference in the frequency between a frequency-divided reference clock signal and the clock signal CLK outputted from the selected VCO.

Figure 14:
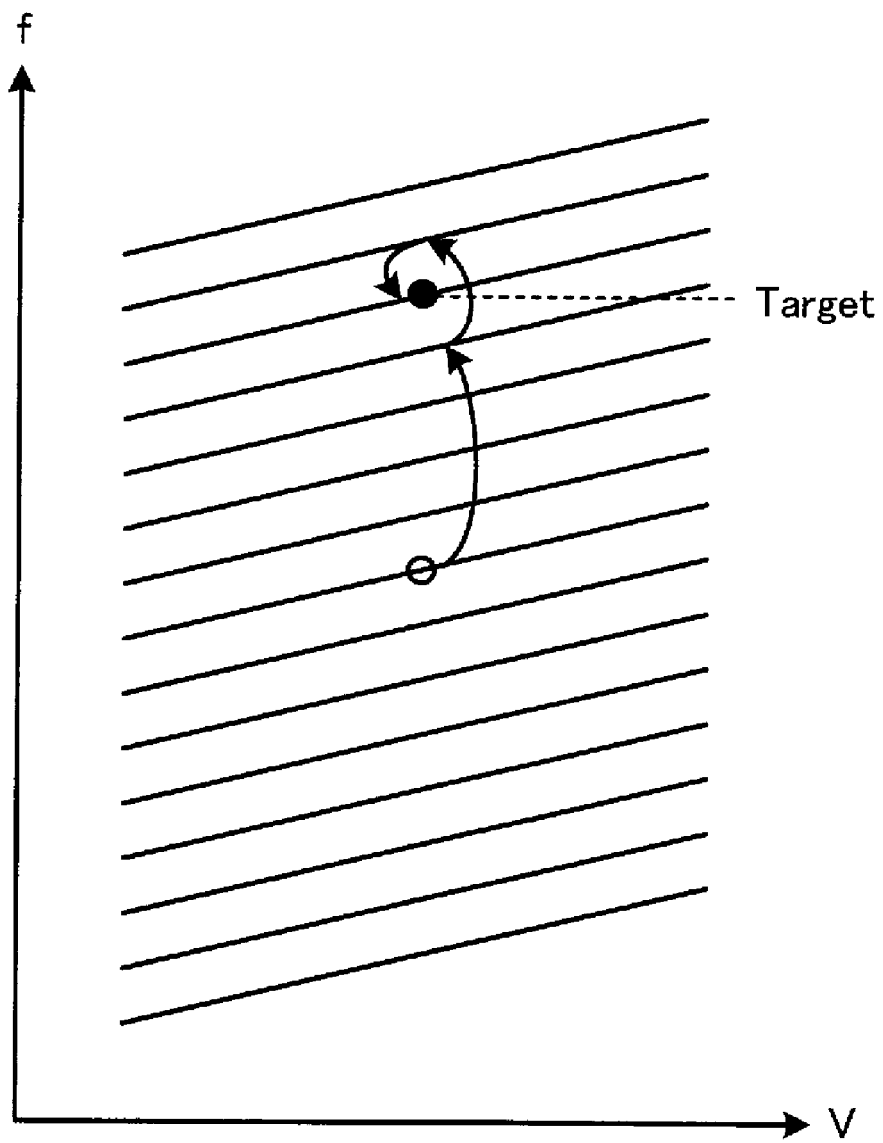
FIG. 14 is a diagram presented for explanation of the sequence of selecting a VCO by a conventional clock selection circuit.

The synthesizer 10 can be used, for example, for TV tuning. In this case, one of VCOs corresponding to a plurality of channels is selected, and a clock signal CLK corresponding to a target channel out of the plurality of channels is outputted by the voltage control in the selected VCO. That is, when a channel is selected, a frequency-division ratio corresponding to the channel is set in the frequency divider 14, and an appropriate VCO is selected by the clock selection circuit 15 by the binary search as illustrated in FIG. 14. Then, the voltage of the selected VCO is controlled so that the target clock signal CLK is outputted.

Figure 3:
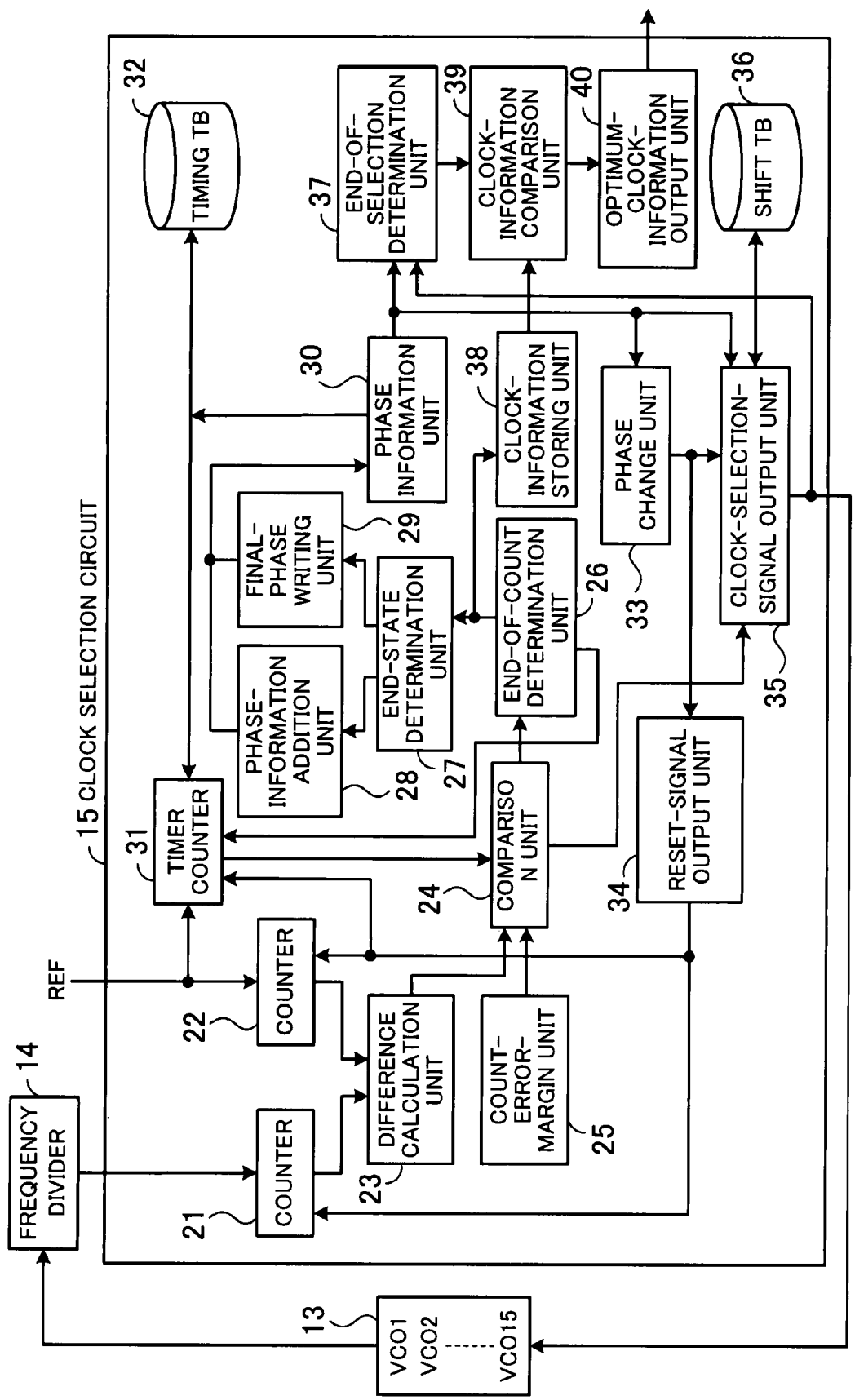
FIG. 3 is a circuit diagram of the clock selection circuit.

Next, details of the clock selection circuit 15 are explained. FIG. 3 is a circuit diagram of the clock selection circuit. As illustrated in FIG. 3, the clock selection circuit 15 comprises counters 21 and 22, a difference calculation unit 23, a comparison unit 24, a count-error-margin unit 25, an end-of-count determination unit 26, an end-state determination unit 27, a phase-information addition unit 28, a final-phase writing unit 29, a phase information unit 30, a timer counter 31, a timing TB 32, a phase change unit 33, a reset-signal output unit 34, a clock-selection-signal output unit 35, a shift TB 36, an end-of-selection determination unit 37, a clock-information storing unit 38, a clock-information comparison unit 39, and an optimum-clock-information output unit 40. In addition, the frequency divider 14, the VCO group 13, and the reference clock signal REF, which are indicated in FIG. 2, are also indicated in FIG. 3.

The counter 21 counts clock pulses in the frequency-divided clock signal outputted from the frequency divider 14. The counter 22 counts clock pulses in the reference clock signal REF. The difference calculation unit 23 obtains the difference between the count of clock pulses in the frequency-divided clock signal obtained by the counter 21 and the count of clock pulses in the reference clock signal REF obtained by the counter 22.

When the comparison unit 24 receives a comparison-instruction signal from the timer counter 31, the comparison unit 24 compares the count of clock pulses in the frequency-divided clock signal and the count of clock pulses in the reference clock signal REF, and determines whether or not the counts are equal, or which count is greater, on the basis of the difference value outputted from the difference calculation unit 23. When the difference value is within a range indicated by the count-error-margin unit 25, the comparison unit 24 determines that the counts obtained by the counters 21 and 22 are equal. Since the reference clock signal REF and the frequency-divided clock signal are asynchronous, the timings of rising and falling of the reference clock signal REF and the frequency-divided clock signal can drift, so that errors which can occur in the counts should be considered.

When the comparison unit 24 determines that a difference between the count of the frequency-divided clock signal and the count of the reference clock signal REF occurs, or when the count of the timer counter 31 reaches the final count value indicated by the timing TB 32 without occurrence of a difference between the count of the frequency-divided clock signal and the count of the reference clock signal REF, the end-of-count determination unit 26 outputs to the end-state determination unit 27 and the clock-information storing unit 38 a signal indicating the occurrence of the difference or the completion of the counting up to the final count value without occurrence of the difference, and ends the counting operation of the timer counter 31.

The end-state determination unit 27 determines whether the updating of the count is ended by the end-of-count determination unit 26 because of the occurrence of the difference between the count of the frequency-divided clock signal and the count of the reference clock signal REF, or because of the completion of the counting up to the final count value without occurrence of the difference between the count of the frequency-divided clock signal and the count of the reference clock signal REF. When the end-state determination unit 27 determines that the updating of the count is ended because of the occurrence of the difference between the count of the frequency-divided clock signal and the count of the reference clock signal REF, the end-state determination unit 27 informs the phase-information addition unit 28 of the determination by the end-state determination unit 27, so that the phase-information addition unit 28 increments the value of phase information held by the phase information unit 30 by one. On the other hand, when the end-state determination unit 27 determines that the updating of the count is ended because of the completion of the counting up to the final count value without occurrence of the difference between the count of the frequency-divided clock signal and the count of the reference clock signal REF, the end-state determination unit 27 informs the final-phase writing unit 29 of the determination by the end-state determination unit 27, so that the final-phase writing unit 29 adds one to the value of the phase information, and writes the incremented value of the phase information in the phase information unit 30. For example, in the case where the value of the phase information can vary from "0" to "3," and the counting operation by the timer counter 31 is ended in the phase "1" because the timer counter 31 has counted up to the final count value, the final-phase writing unit 29 adds "1" to the value "3" indicating the final phase, and writes the value "4" in the phase information unit 30.

That is, when a difference between the count of the frequency-divided clock signal and the count of the reference clock signal REF occurs because the currently selected VCO is not correct, the value of the phase information is incremented, so that the operation of the clock selection circuit 15 enters the next phase for selecting a VCO which is closer to the correct VCO. On the other hand, when no difference occurs between the count of the frequency-divided clock signal and the count of the reference clock signal REF during the counting operation performed for a predetermined time, it is determined that a correct VCO is selected, so that the final value "3" of the phase information plus one is written in the phase information unit 30.

When a reset signal is outputted from the reset-signal output unit 34, the timer counter 31 starts counting from zero. When the count of the timer counter 31 reaches a value indicated in the timing TB 32, the timer counter 31 outputs a comparison-instruction signal to the comparison unit 24.

Figure 4:
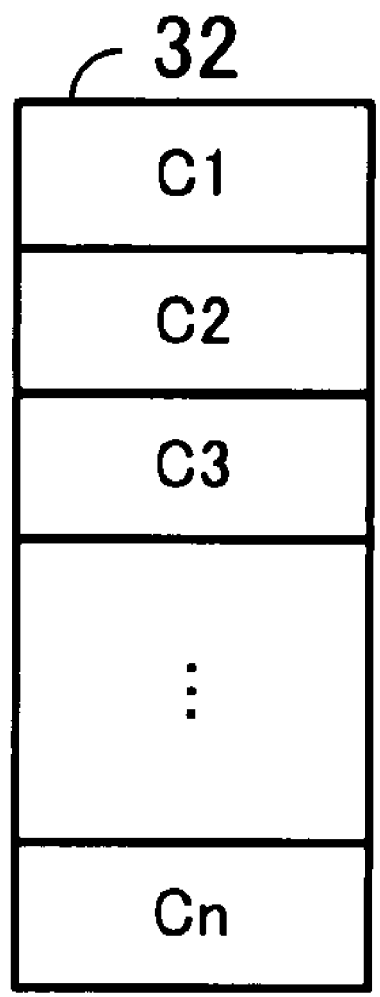
FIG. 4 is a diagram illustrating an example of a data structure of a timing TB.

Next, the timing TB 32 is explained in detail below. FIG. 4 is a diagram illustrating an example of a data structure of the timing TB. As illustrated in FIG. 4, the count values C1 to Cn, which are to be referred to by the timer counter 31, are stored in the timing TB 32.

When the count of the timer counter 31 reaches one of the values C1 to Cn, the timer counter 31 outputs a comparison-instruction signal. The values C1 to Cn satisfy the relationships, C1<C2<...<Cn. The values C1 to Cn are determined so that a plurality of comparison-instruction signals are outputted during an interval in which a difference occurs between the counts of clock pulses outputted from two VCOs having the closest frequencies. Therefore, for example, when a VCO closest to the target VCO is selected, and the counters 21 and 22 perform the counting operations, a plurality of comparison-instruction signals are outputted during an interval in which a difference occurs between the counts of the counters 21 and 22. In addition, the timings at which the comparison-instruction signals are outputted are determined so that the comparison unit 24 can correctly determine which of the frequency-divided clock signal and the reference clock signal has a higher frequency even when the frequency-divided clock signal and the reference clock signal are asynchronous and an error occurs in the counts of the counters 21 and 22.

Referring back to FIG. 3, when the phase information in the phase information unit 30 is updated, the phase change unit 33 outputs a signal indicating the update to the reset-signal output unit 34, the clock-selection-signal output unit 35, and the end-of-selection determination unit 37. When the reset-signal output unit 34 receives the signal indicating the update from the phase change unit 33, the reset-signal output unit 34 outputs a reset signal to the counters 21 and 22 and the timer counter 31. The counters 21 and 22 and the timer counter 31 are reset to zero on receipt of the reset signal. When the clock-selection-signal output unit 35 receives the signal indicating the update from the phase change unit 33, the clock-selection-signal output unit 35 refers to the shift TB 36, and acquires an amount by which the code is to be changed (the amount of change in the code), on the basis of the phase information and the result of the comparison made by the comparison unit 24.

Figure 5:
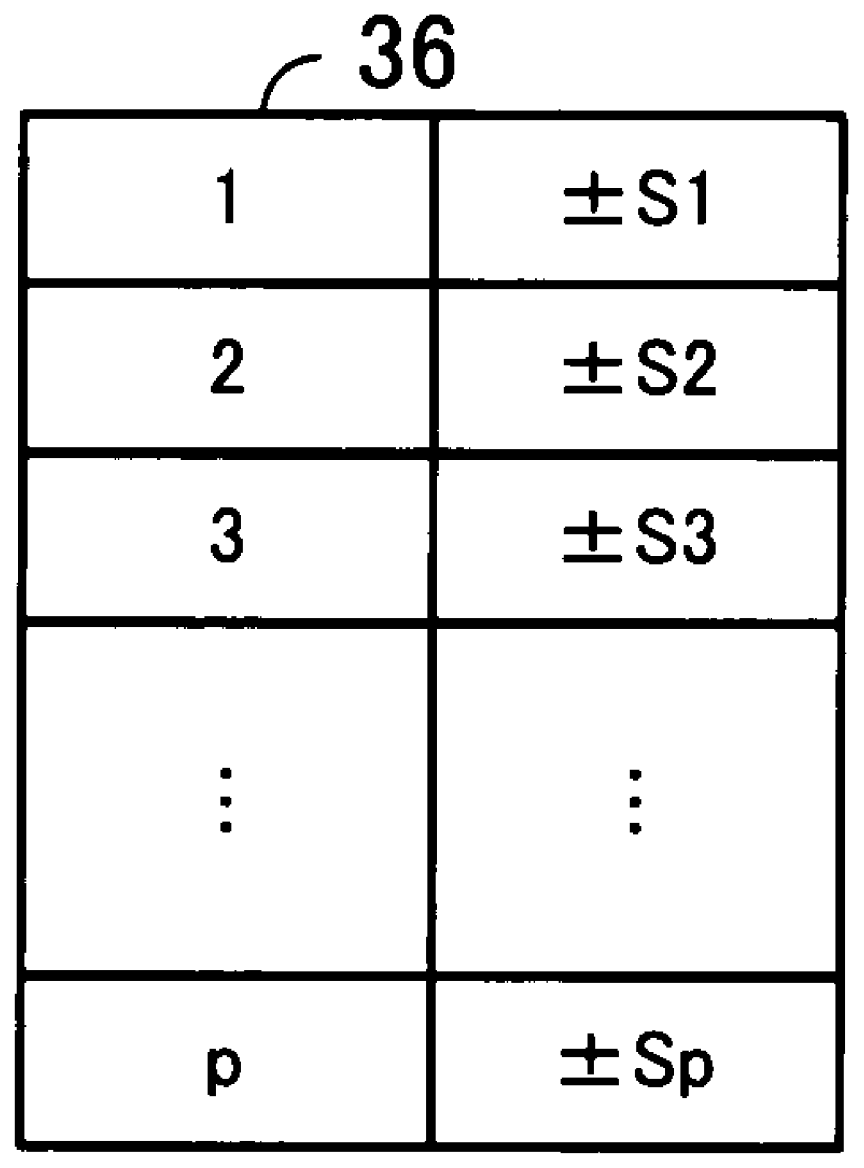

Next, the shift TB 36 is explained in detail below. FIG. 5 is a diagram illustrating an example of a data structure of the shift TB. As illustrated in FIG. 5, the amounts of change corresponding to the respective phases are stored in the shift TB 36. In the example of FIG. 5, the amounts of change corresponding to the phase "1" are ±S1, the amounts of change corresponding to the phase "2" are ±S2, the amounts of change corresponding to the phase "p" are ±Sp, and the amounts of change satisfy the relationships, $Sp/(Sp-1)=(Sp-1)/(Sp-2)=\ldots=S2/S1=\frac{1}{2}$. In the following explanations, it is assumed that the shift TB 36 stores the amounts of change ±4, ±2, and ±1 respectively corresponding to the phases 1, 2, and 3. The manner of reducing the range of selection by $Sp/(Sp-1)=\frac{1}{2}$ on every phase change is known as the binary search. For example, when the number of VCOs in the VCO group is not equal to $2^N-1$, the amounts of change are adjusted.

Since the initial value of the phase information is "0," the clock-selection-signal output unit 35 first outputs the code "8," so that the VCO8 in the center is selected. Therefore, when the comparison unit 24 outputs a comparison result, the value of the phase information becomes "1," and the clock-selection-signal output unit 35 changes the code by +4 or −4 according to the comparison result and the phase information "1." Thereafter, the code is successively changed until the frequency of the VCO matches the target frequency.

The end-of-selection determination unit 37 determines whether or not the phase information in the phase information unit 30 has the value equal to the final phase value plus one, in order to determine whether or not the sequence of selecting an optimum VCO is completed. For example, in the case where the number of the VCOs in the VCO group is 15, the sequence of selecting a VCO is completed when the phase information is "3." Therefore, when the phase information in the phase information unit 30 has the value "4" (the value "3" indicating the final phase plus one), the end-of-selection determination unit 37 determines that the sequence of selecting a VCO is completed.

The clock-information storing unit 38 stores the number of the VCO selected in the immediately preceding phase and the count value which is used for determining the timing of the comparison in the immediately preceding phase.

When the end-of-selection determination unit 37 determines that the sequence for selecting a VCO is completed, the clock-information comparison unit 39 compares one of the count values C1 to Cn which is used for finally selecting an optimum VCO with another of the count values C1 to Cn which is used for determining the time of the selection of a VCO in the immediately preceding phase and stored in the clock-information storing unit 38. Then, the clock-information comparison unit 39 determines that one of the two VCOs corresponding to the greater count value is to be selected as an optimum VCO. When the clock-information comparison unit 39 determines that the VCO selected in the immediately preceding phase is optimum, the clock-information comparison unit 39 instructs the clock-selection-signal output unit 35 to select the VCO determined to be optimum.

The optimum-clock-information output unit 40 externally outputs a signal indicating completion of selection of the optimum VCO in response to the determination by the clock-information comparison unit 39, although the output of this information is not indicated in FIG. 2.

Figure 6A:
FIG. 6 is a diagram presented for explaining timings of comparisons made by a comparison unit.
Figure 6B:
Figure 15:
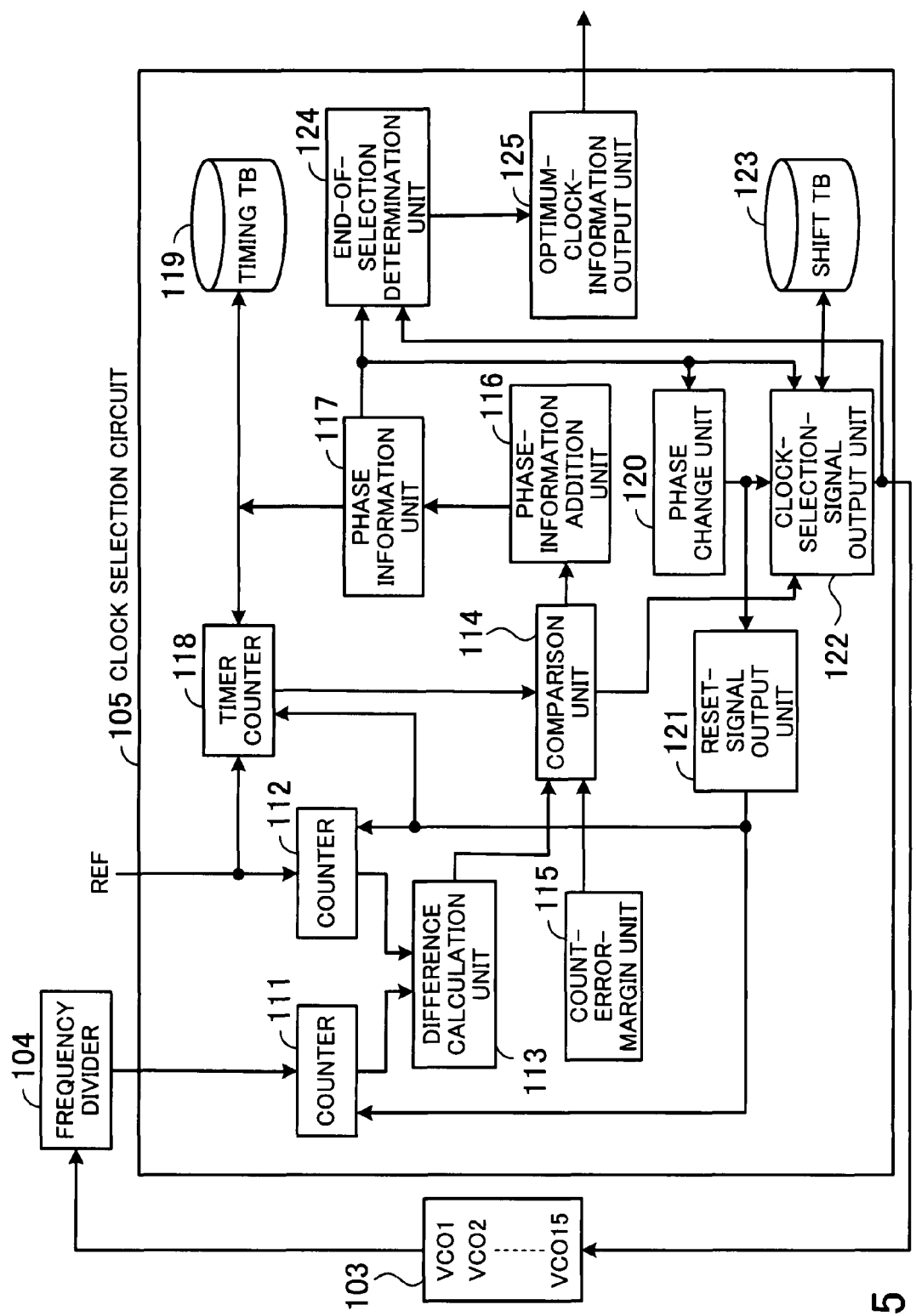
FIG. 15 is a circuit diagram of a conventional clock selection circuit.
Figure 16:
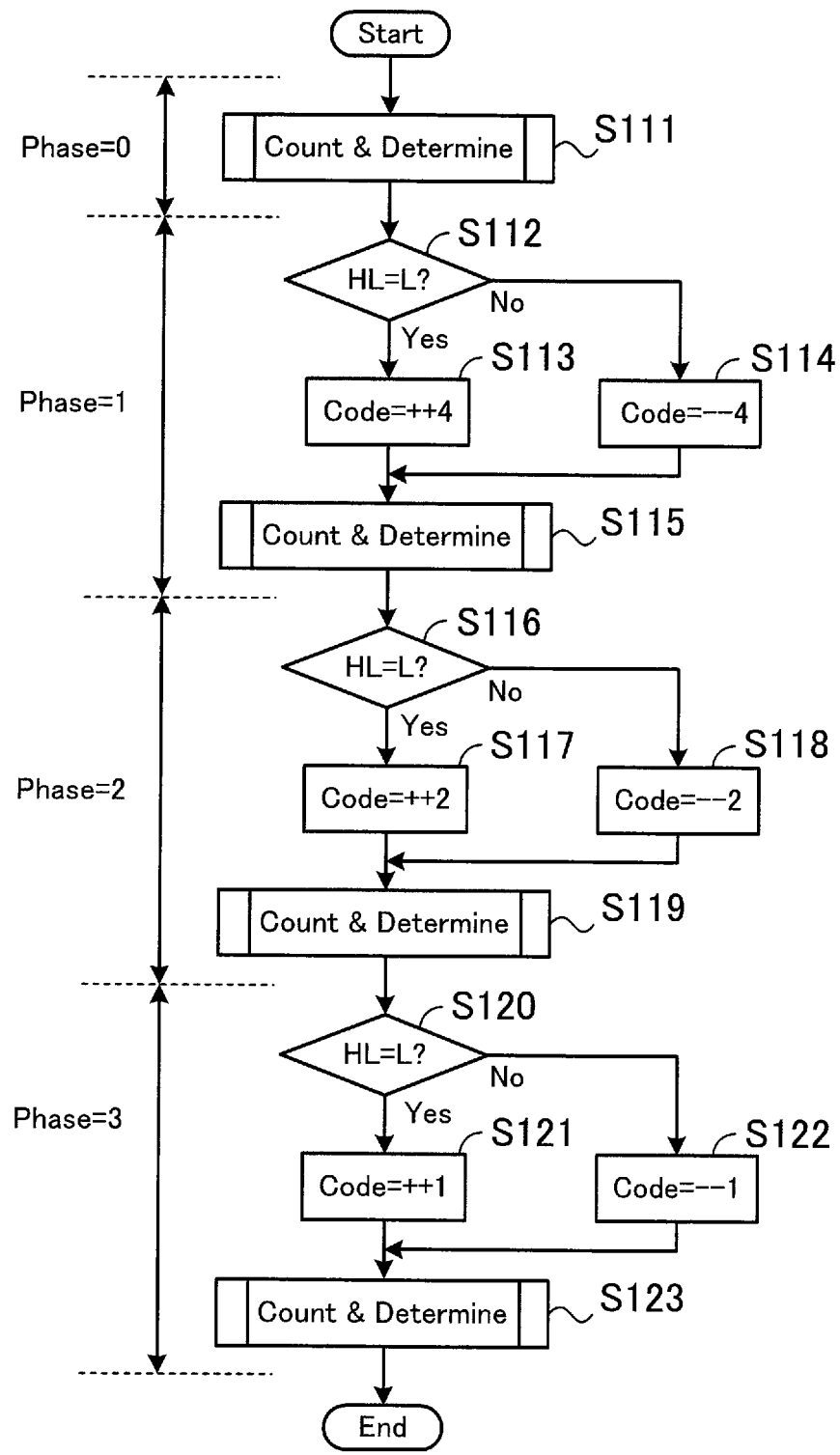
FIG. 16 is a flowchart indicating operations of the conventional clock selection circuit.

Next, the timings of comparisons made by the comparison unit 24 are explained below. FIG. 6 is a diagram presented for explaining the timings of comparisons made by the comparison unit. The timings of comparisons made by the comparison unit 24 are indicated in the part (A) of FIG. 6, and the timings of comparisons made by the comparison unit 114 in FIG. 15 are indicated in the part (B) of FIG. 6. In FIG. 6, the filled circles and the blank circles indicate the timings of comparisons. Specifically, the filled circles indicate the timings at each of which both of a comparison and selection of a VCO are made, and the blank circles indicate the timings at each of which a comparison is made and selection of a VCO is not made.

As indicated in the part (A) of FIG. 6, the comparison unit 24 compares the count of clock pulses in the frequency-divided clock signal and the count of clock pulses in the reference clock signal REF, and determines whether or not the counts are equal, or which count is greater, on receipt of a comparison-instruction signal at each of the illustrated timings. The timings of the comparisons are determined on the basis of the count values C1 to Cn indicated in the timing TB 32. Therefore, if it is determined that the count of clock pulses in the frequency-divided clock signal and the count of clock pulses in the reference clock signal REF are equal at the fourth timing of comparison after the timing indicated by the leftmost, filled circle in the part (A) of FIG. 6, immediately a new VCO is selected, and the operation enters the next phase. Thereafter, comparisons are made at the timings determined by ones of the count values C1 to Cn.

On the other hand, in the comparison unit 114 indicated in the part (B) of FIG. 6, the comparisons are made and new VCOs are successively selected at regular intervals which are set so that a difference necessarily occurs between the count of the frequency-divided clock signal and the count of the reference clock signal REF in each interval. Therefore, even when a difference actually occurs between the count of the frequency-divided clock signal and the count of the reference clock signal REF before the next timing of comparison, a new VCO is not selected until the next timing of comparison. Thus, useless time is spent before the optimum VCO is selected. However, the comparison unit 24 in the clock selection circuit 15 makes a plurality of comparisons during each of the regular intervals indicated in the part (B) of FIG. 6, so that the clock selection circuit 15 selects a new VCO immediately when a difference occurs between the count of the frequency-divided clock signal and the count of the reference clock signal REF, and the operation of the clock selection circuit 15 enters the next phase. Consequently, the clock selection circuit 15 can select an optimum VCO in a short time.

Figure 7:
FIG. 7 is a diagram presented for explaining a clock-information storing unit and a clock-information comparison unit.

Next, the clock-information storing unit 38 and the clock-information comparison unit 39 are explained below. FIG. 7 is a diagram presented for explaining the clock-information storing unit and the clock-information comparison unit. In FIG. 7, "C1," "C3," "C5," and "C4" are count values indicated in the timing TB 32, and each of "C1," "C3," "C5," and "C4" is also a count value of the timer counter 31 when a difference occurs between the count of the frequency-divided clock signal and the count of clock pulses in the reference clock signal REF. The numbers "8," "12," "14," and "13" indicated in FIG. 7 are values of the code indicating the selected VCOs. In the example of FIG. 7, the initial value of the code is "8." The value of the code is changed every time the phase is changed, so that the target VCO13 is finally selected. Specifically, the code is changed by +4, +2, and −1 in the respective phase changes.

Generally, the count value increases as the selected VCO approaches the target VCO. This is because when the frequency of the selected VCO comes closer to the frequency of the target VCO, it takes more time until a difference occurs between the count of clock pulses outputted from the selected VCO and the count of clock pulses outputted from the target VCO. However, in some cases, the count value in a phase can be smaller than the count value in a preceding phase. In the example of FIG. 7, the count value becomes "C4" after the count value increases as "C1"–>"C3"–>"C5." Hereinbelow, a case where the count value in a phase becomes smaller than the count value in a preceding phase even when the selected VCO approaches the target VCO are explained.

Figure 8:
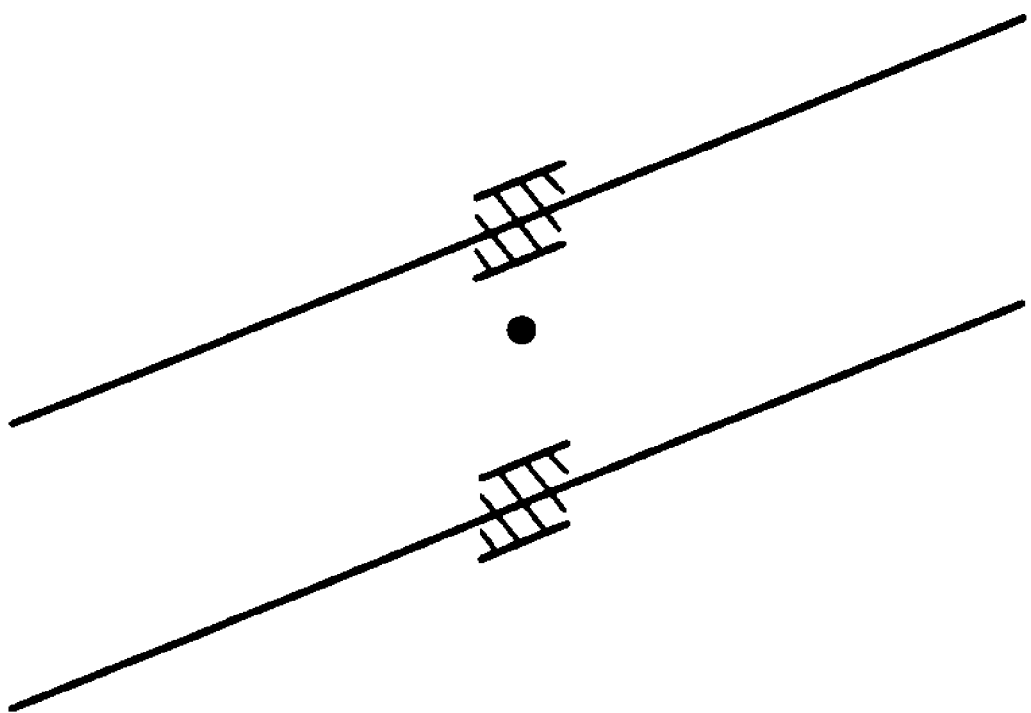
FIG. 8 is a diagram presented for explaining a case where a count value decreases.

FIG. 8 is a diagram presented for explaining a case where the count value in a phase becomes smaller than the count value in a preceding phase even when the selected VCO approaches the target VCO. The upper oblique line in FIG. 8 indicates the characteristic of the VCO14 in the example of FIG. 7, the lower oblique line in FIG. 8 indicates the characteristic of the VCO13 in the example of FIG. 7, and the filled circle in FIG. 8 indicates the target VCO.

In addition, the hatched areas in FIG. 8 indicate the ranges of the target VCO in which no difference occurs between the count of the frequency-divided clock signal and the count of the reference clock signal REF when the count of the timer counter 31 is "C6." That is, in the case where the target VCO is in the ranges indicated by the hatched areas in FIG. 8, no difference occurs between the count of the frequency-divided clock signal and the count of the reference clock signal REF when the count of the timer counter 31 is "C6."

In FIG. 7, although a difference occurs between the count of clock pulses in the frequency-divided clock signal and the count of clock pulses in the reference clock signal REF when the count of the timer counter 31 is "C5" in the phase "2" (in which the VCO14 is selected), a difference occurs between the count of clock pulses in the frequency-divided clock signal and the count of clock pulses in the reference clock signal REF when the count of the timer counter 31 is "C4," not "C6," in the phase "3." That indicates that even after the operation enters the new phase "3," the difference between the count of clock pulses in the frequency-divided clock signal and the count of clock pulses in the reference clock signal REF increases. This phenomenon occurs when the target VCO is not in the ranges in which no difference occurs between the count of the frequency-divided clock signal and the count of the reference clock signal REF when the count of the timer counter 31 is "C6." The decrease in the count value can occur in any phase during the binary search. For example, in the case where the target VCO is the VCO9 and the binary search is started from the VCO8, when the selected VCO is changed from the VCO8 to the VCO12 by changing the code by +4, the frequency of the selected VCO is further separated from the frequency of the target VCO9.

In the case of FIG. 7, although the target VCO is nearer to the VCO14 than to the VCO13 as illustrated in FIG. 8, the VCO13 is selected in the final phase. Therefore, according to the embodiment, the clock-information storing unit 38 stores the number indicating the immediately precedingly selected VCO and the count value which is used for determining the timing of the comparison for the immediately precedingly selected VCO, and the clock-information comparison unit 39 compares the count value which is used for finally determining an optimum VCO with the count value which is used for determining the timing of the selection of a VCO in the immediately preceding phase and stored in the clock-information storing unit 38, and determines that one of the two VCOs corresponding to the greater count value is to be selected as an optimum VCO. Although the VCO13 is selected in the final phase "3" in the example of FIG. 7, the clock-information comparison unit 39 determines that the frequency of the VCO14 is nearer to the frequency of the target VCO than the VCO13 and the VCO14 is to be selected.

Next, the manner of determining the count values in the timing TB 32 is explained below. FIG. 9 is a diagram illustrating a table presented for explaining the manner of determining the count values.

The table 51 illustrated in FIG. 9 indicates examples of the difference between the frequency of the selected VCO and the frequency of the target VCO and the count values. In the table 51, "M=2" indicates that a value indicated by the count-error-margin unit 25 is "2." That is, when the difference between the count of the selected VCO and the count of the target VCO does not exceed "2," the frequencies of the selected VCO and the target VCO are assumed to be identical. (Hereinafter, the maximum difference between the count of the selected VCO and the count of the target VCO which is assumed to be zero is referred to as a margin.) In addition, since the selected VCO and the target VCO are asynchronous, according to the timings of the rising and falling of the clock pulses, the difference between the count of the selected VCO and the count of the target VCO can vary by ±1 even in the case where the margin is set to "2" as above. The values indicated in the fields of "M=1" and "M=3" in the table 51 are the differences between the frequencies of the selected VCOs and the frequency of the target VCO when the differences between the counts of the selected VCOs and the count of the target VCO vary by ±1 (i.e., the differences vary so that the margin "2" is substantially increased or reduced by one).

For example, the table 51 indicates that in the case where the difference between the count of a selected VCO and the count of the target VCO is three or greater when the count of the timer counter 31 is "1 (C1)," the difference between the frequencies of the clock signals outputted from the two VCOs is ±100.0 KHz or greater, and the table 51 also indicates that in the case where the difference between the count of a selected VCO and the count of the target VCO is three or greater when the count of the timer counter 31 is "4 (C2)," the difference between the frequencies of the clock signals outputted from the two VCOs is ±29.4 KHz or greater.

Further, as mentioned before, the difference between the count of the selected VCO and the count of the target VCO can vary by ±1 even in the case where the margin is set to "2." Therefore, for example, even in the case where the difference between the count of a selected VCO and the count of the target VCO is detected to be three or greater when the count of the timer counter 31 is "1 (C1)," the difference between the count of the selected VCO and the count of the target VCO can actually vary by −1 (i.e., so that the margin "2" is substantially reduced by one). The table 51 indicates that the difference between the frequencies of the clock signals outputted from the two VCOs in such a case is ±55.6 KHz or greater. In addition, even in the case where the difference between the count of a selected VCO and the count of the target VCO is detected to be three or greater when the count of the timer counter 31 is "1 (C1)," the difference between the count of the selected VCO and the count of the target VCO can actually vary by +1 (i.e., so that the margin "2" is substantially increased by one). The table 51 indicates that the difference between the frequencies of the clock signals outputted from the two VCOs in such a case is ±300.0 KHz or greater.

Figure 10:
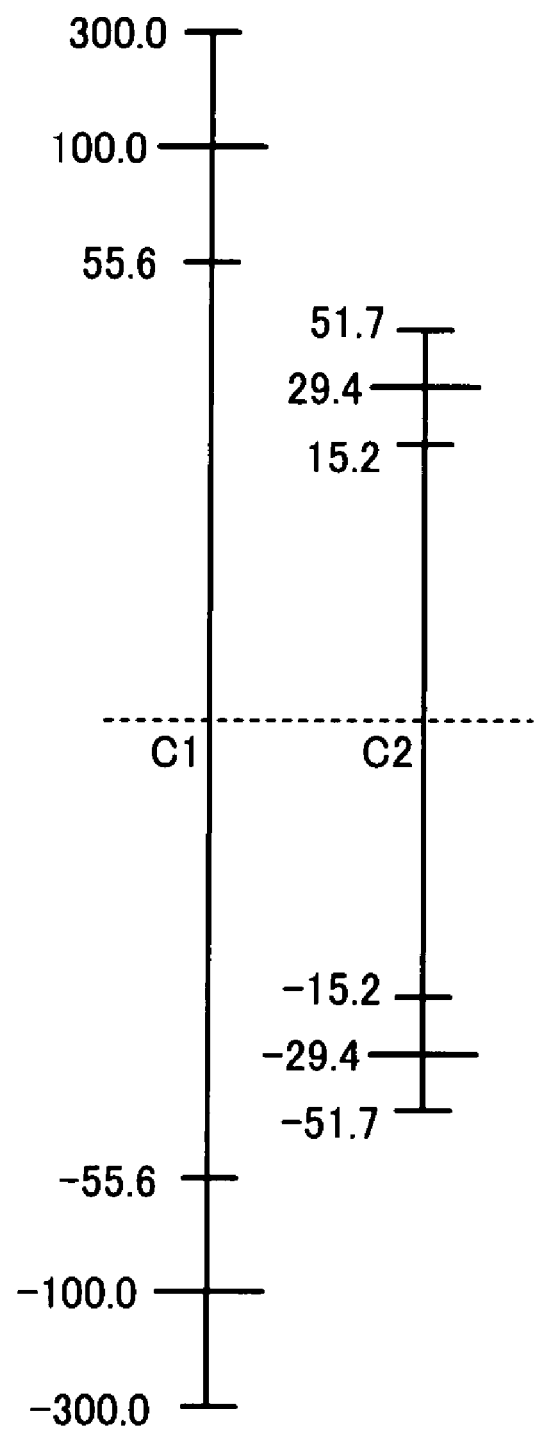
FIG. 10 is a diagram presented for explaining the manner of determining the count values.

It is necessary to determine the count values C1 to C5 in the table 51 so that each frequency range in which the frequency difference is lower than one of the values indicated in the field of "M=3" does not overlap the frequency range in which the frequency difference is equal to or greater than the value indicated in the field of "M=1" and connected to the one of the values in the field of "M=3" with an arrowed line in the table 51. FIG. 10 is a diagram presented for explaining the manner of determining the count values. In the case where the count of the selected VCO is different from the count of the target VCO when the count of the timer counter 31 is "1 (C1)," the difference between the frequencies of the clock signals outputted from the two VCOs is ±55.6 KHz or greater when the difference between the count of the selected VCO and the count of the target VCO varies by −1, ±100.0 KHz or greater when the difference between the count of the selected VCO and the count of the target VCO does not vary, and ±300.0 KHz or greater when the difference between the count of the selected VCO and the count of the target VCO varies by +1.

In the case where the count of the selected VCO is different from the count of the target VCO when the count of the timer counter 31 is "4 (C2)," the difference between the frequencies of the clock signals outputted from the two VCOs is ±15.2 KHz or greater when the difference between the count of the selected VCO and the count of the target VCO varies by −1, ±29.4 KHz or greater when the difference between the count of the selected VCO and the count of the target VCO does not vary, and ±51.7 KHz or greater when the difference between the count of the selected VCO and the count of the target VCO varies by +1.

If the count value C2 is determined in such a manner that the frequency range in which the frequency difference is lower than the value ("51.7 KHz" in the example of the table 51) indicated in the field of "M=3" in correspondence with the count value "C2" overlaps the frequency range in which the frequency difference is equal to or greater than the value ("55.6 KHz" in the example of the table 51) indicated in the field of "M=1" in correspondence with the count value "C1," and a currently selected VCO has a frequency in the overlapping frequency range, the difference between the count of the currently selected VCO and the target VCO can become equal to or greater than two even when the frequency of the currently selected VCO is close to the frequency range corresponding to the count value "C2." Therefore, generally, the count value "Cn" is determined so that the frequencies of the selected VCOs which are detected to be different from the target VCO when the count of the timer counter 31 is "Cn" and the errors in the differences between the counts of the selected VCOs and the counts of the target VCO are −1 are higher than the frequencies of the selected VCOs which are detected to be different from the target VCO when the count of the timer counter 31 is "Cn+1" and the errors in the differences between the counts of the selected VCOs and the counts of the target VCO are +1.

Next, a manner of determination is explained below. FIG. 11 is a diagram presented for explaining a manner of determination. In the table 52 of FIG. 11, the amounts of change in the code in the phases "1," "2," and "3" are indicated in the field "Amount of Change after Determination," and the times necessary for selection of a VCO are indicated in the field "Determination Time." In addition, "Dynamic" means that the timing of comparison for selection of a VCO is dynamically changed, and "tf" is the time in which a difference occurs between the counts of clock pulses outputted from VCOs having the closest frequencies, for example, the VCOs the characteristics of which are indicated at the bottom and the next to the bottom in FIG. 17.

In the clock selection circuit 15 of FIG. 3, the comparison of the selected VCO and the target VCO is dynamically made at the timings based on the count values indicated in the timing TB 32. Therefore, a VCO which is to be selected in each phase can be determined in a time interval of tf/n to tf.

In addition, "Execution" in the field "Partway Determination" indicates that comparison of a selected VCO with the target VCO is dynamically made, while the timings of comparison are fixed in the clock selection circuit 105 illustrated in FIG. 15. Further, "Possible" in the field "Determination of Completion of Selection" indicates that when the operation in the phase "1" or "2" is continued to the final round, the operation skips over the following phase or phases including the phase "3", and the sequence of selection is completed. Further, "Execution" in the field "Determination of Completion of Selection" indicates that the count value "Cx" in the final phase is compared with the count value "Cy" in the immediately preceding phase, and a VCO corresponding to a greater count value is selected.

Figure 12:
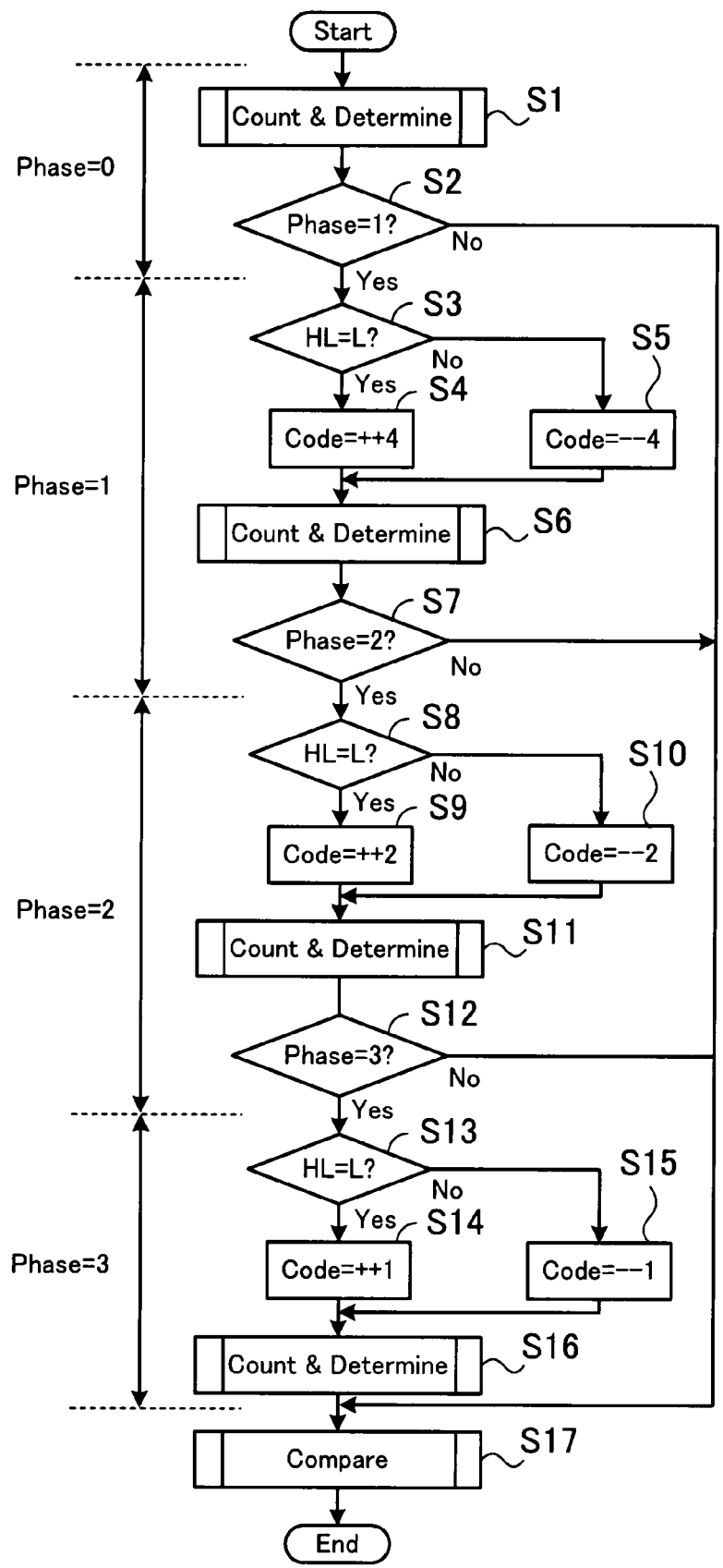
FIG. 12 is a flowchart indicating operations of the clock selection circuit.
Figure 13:
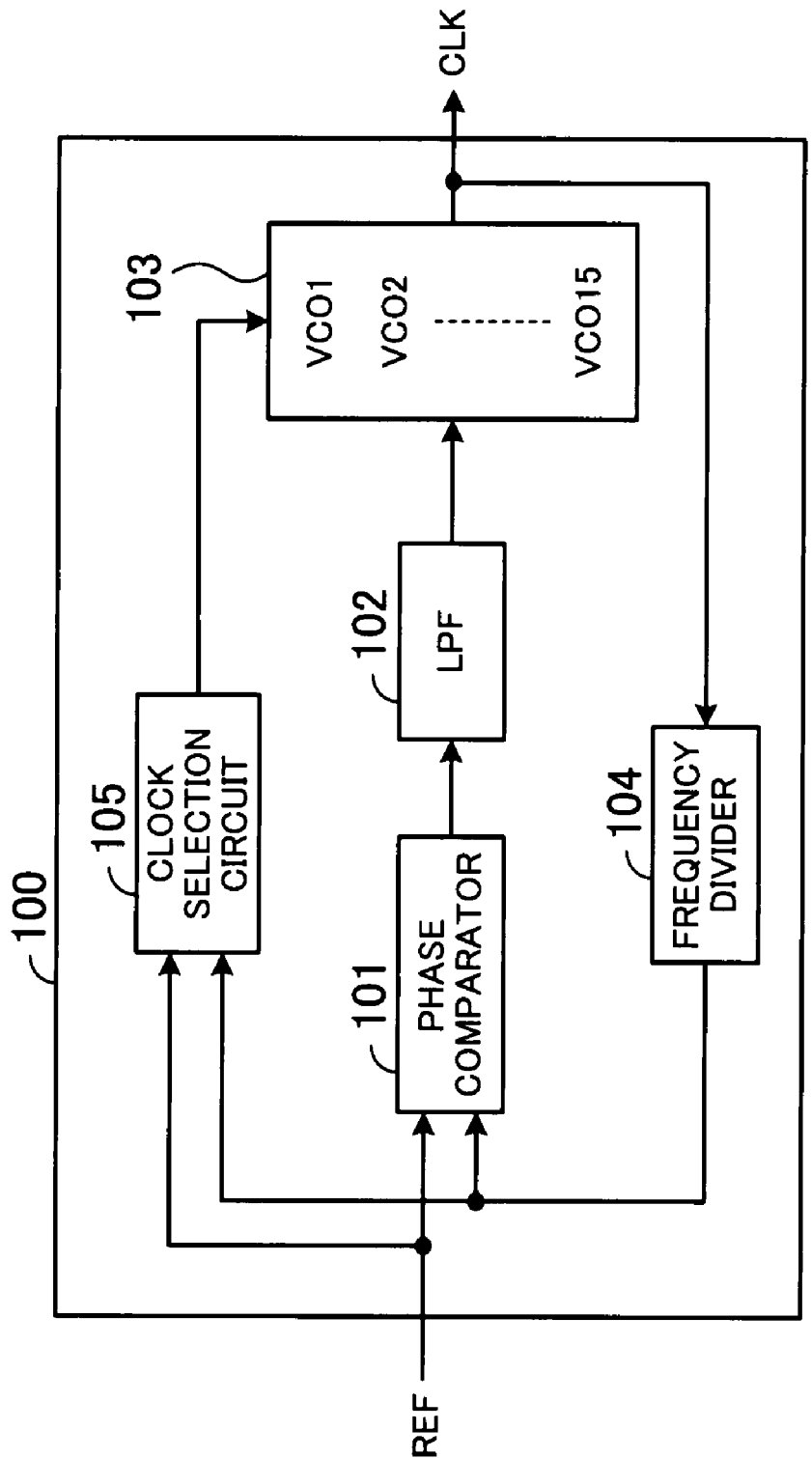
FIG. 13 is a block diagram illustrating the conventional synthesizer.

Next, the operations of the clock selection circuit 15 of FIG. 3 are explained with reference to a flowchart. FIG. 12 is a flowchart indicating the operations of the clock selection circuit.

In step S1, the timer counter 31 in the clock selection circuit 15 starts counting. When the count of the timer counter 31 reaches one of the count values C1 to Cn, the timer counter 31 outputs a comparison-instruction signal to the comparison unit 24. At this time, the phase of the clock selection circuit 15 is "0," i.e., the VCO8 is selected.

Every time the comparison unit 24 receives a comparison-instruction signal from the timer counter 31, the comparison unit 24 determines whether the frequency of the selected VCO8 is higher or lower the frequency of the target clock signal, and also determines whether or not the frequency of the selected VCO8 is equal to the frequency of the target clock signal.

When the comparison unit 24 determines that a difference occurs between the count of clock pulses in the frequency-divided clock signal and the count of clock pulses in the reference clock signal REF, or when the comparison unit 24 determines that the counting operation is performed up to the final count value indicated in the timing TB 32 without occurrence of a difference between the count of clock pulses in the frequency-divided clock signal and the count of clock pulses in the reference clock signal REF, the end-of-count determination unit 26 outputs to the end-state determination unit 27 and the clock-information storing unit 38 a signal indicating the occurrence of the difference or the completion of the counting up to the final count value without occurrence of the difference, and ends the counting operation of the timer counter 31.

The end-state determination unit 27 determines whether the updating of the count is ended by the end-of-count determination unit 26 because of the occurrence of the difference between the count of the frequency-divided clock signal and the count of the reference clock signal REF, or because of the completion of the counting up to the final count value without occurrence of the difference between the count of the frequency-divided clock signal and the count of the reference clock signal REF. When the end-state determination unit 27 determines that the updating of the count is ended because of the occurrence of the difference, the end-state determination unit 27 informs the phase-information addition unit 28 of the determination by the end-state determination unit 27, so that the phase-information addition unit 28 increments the value of the phase information held by the phase information unit 30 by one. On the other hand, when the end-state determination unit 27 determines that the updating of the count is ended because of the completion of the counting up to the final count value without occurrence of the difference between the count of the frequency-divided clock signal and the count of the reference clock signal REF, the end-state determination unit 27 informs the final-phase writing unit 29 of the determination by the end-state determination unit 27, so that the final-phase writing unit 29 adds one to the value "3" indicating the final phase, and writes the incremented value "4" in the phase information unit 30.

In step S2, the end-of-selection determination unit 37 determines whether or not the phase information in the phase information unit 30 is equal to "1" (i.e., whether or not the phase has changed from "0" to "1"), or whether or not the value "4" is written in the phase information unit 30. When the end-of-selection determination unit 37 determines that the phase has changed from "0" to "1," the operation goes to step S3. When the end-of-selection determination unit 37 determines the phase information is "4," the operation goes to step S17, and the clock-selection-signal output unit 35 maintains the selection of the VCO8.

In step S3, when the comparison unit 24 determines that the frequency of the selected VCO is lower than the frequency of the target VCO, the operation of the clock-selection-signal output unit 35 goes to step S4. When the comparison unit 24 determines that the frequency of the selected VCO is higher than the frequency of the target VCO, the operation of the clock-selection-signal output unit 35 goes to step S5.

In step S4, the clock-selection-signal output unit 35 acquires an amount of change from the shift TB 36 on the basis of the phase information held in the phase information unit 30 and the result of the comparison made by the comparison unit 24. Since the phase information is "1," and the comparison unit 24 determines that the frequency of the selected VCO is lower than the frequency of the target VCO, the code is changed by "+4."

In step S5, the clock-selection-signal output unit 35 acquires an amount of change from the shift TB 36 on the basis of the phase information held in the phase information unit 30 and the result of the comparison made by the comparison unit 24. Since the phase information is "1," and the comparison unit 24 determines that the frequency of the selected VCO is higher than the frequency of the target VCO, the code is changed by "−4."

In step S6, the timer counter 31 in the clock selection circuit 15 starts counting from zero. When the count of the timer counter 31 reaches one of the count values C1 to Cn indicated in the timing TB 32, the timer counter 31 outputs a comparison-instruction signal to the comparison unit 24. At this time, the phase of the clock selection circuit 15 is "1," and either of the VCO4 and VCO12 is selected.

Every time the comparison unit 24 receives a comparison-instruction signal from the timer counter 31, the comparison unit 24 determines whether the frequency of the selected VCO is higher or lower than the frequency of the target clock signal, and also determines whether or not the frequency of the selected VCO is equal to the frequency of the target clock signal.

When the comparison unit 24 determines that a difference occurs between the count of the frequency-divided clock signal and the count of the reference clock signal REF, or when the count of the timer counter 31 reaches the final count value indicated by the timing TB 32 without occurrence of a difference between the count of the frequency-divided clock signal and the count of the reference clock signal REF, the end-of-count determination unit 26 outputs to the end-state determination unit 27 and the clock-information storing unit 38 a signal indicating the occurrence of the difference or the completion of the counting up to the final count value without occurrence of the difference, and ends the counting operation of the timer counter 31.

The end-state determination unit 27 determines whether the updating of the count is ended by the end-of-count determination unit 26 because of the occurrence of the difference between the count of the frequency-divided clock signal and the count of the reference clock signal REF, or because of the completion of the counting up to the final count value without occurrence of the difference between the count of the frequency-divided clock signal and the count of the reference clock signal REF. When the end-state determination unit 27 determines that the updating of the count is ended because of the occurrence of the difference between the count of the frequency-divided clock signal and the count of the reference clock signal REF, the end-state determination unit 27 informs the phase-information addition unit 28 of the determination by the end-state determination unit 27, so that the phase-information addition unit 28 increments the value of the phase information held by the phase information unit 30 by one. On the other hand, when the end-state determination unit 27 determines that the updating of the count is ended because of the completion of the counting up to the final count value without occurrence of the difference between the count of the frequency-divided clock signal and the count of the reference clock signal REF, the end-state determination unit 27 informs the final-phase writing unit 29 of the determination by the end-state determination unit 27, so that the final-phase writing unit 29 writes the value "4" in the phase information unit 30.

In step S7, the end-of-selection determination unit 37 determines whether or not the phase information held in the phase information unit 30 is "2," i.e., whether the phase has changed to "2" or the value "4" is written in the phase information unit 30. When the end-of-selection determination unit 37 determines that the phase has changed to "2," the operation goes to step S8. When the end-of-selection determination unit 37 determines that the phase information is "4," the operation goes to step S17, and the clock-selection-signal output unit 35 maintains the selection of the VCO4 or the VCO12.

In step S8, when the comparison unit 24 determines that the frequency of the selected VCO is lower than the frequency of the target VCO, the operation of the clock-selection-signal output unit 35 goes to step S9. When the comparison unit 24 determines that the frequency of the selected VCO is higher than the frequency of the target VCO, the operation of the clock-selection-signal output unit 35 goes to step S10.

In step S9, the clock-selection-signal output unit 35 acquires an amount of change from the shift TB 36 on the basis of the phase information held in the phase information unit 30 and the result of the comparison made by the comparison unit 24. Since the phase information is "2," and the comparison unit 24 determines that the frequency of the selected VCO is lower than the frequency of the target VCO, the code is changed by "+2."

In step S10, the clock-selection-signal output unit 35 acquires an amount of change from the shift TB 36 on the basis of the phase information held in the phase information unit 30 and the result of the comparison made by the comparison unit 24. Since the phase information is "2," and the comparison unit 24 determines that the frequency of the selected VCO is higher than the frequency of the target VCO, the code is changed by "−2."

In step S11, the timer counter 31 in the clock selection circuit 15 starts counting from zero. When the count of the timer counter 31 reaches one of the count values C1 to Cn indicated in the timing TB 32, the timer counter 31 outputs a comparison-instruction signal to the comparison unit 24. At this time, the phase of the clock selection circuit 15 is "2," and one of the VCO10, the VCO14, the VCO2, and VCO6 is selected.

Every time the comparison unit 24 receives a comparison-instruction signal from the timer counter 31, the comparison unit 24 determines whether the frequency of the selected VCO is higher or lower than the frequency of the target clock signal, and also determines whether or not the frequency of the selected VCO is equal to the frequency of the target clock signal.

When the comparison unit 24 determines that a difference occurs between the count of the frequency-divided clock signal and the count of the reference clock signal REF, or when the count of the timer counter 31 reaches the final count value indicated by the timing TB 32 without occurrence of a difference between the count of the frequency-divided clock signal and the count of the reference clock signal REF, the end-of-count determination unit 26 outputs to the end-state determination unit 27 and the clock-information storing unit 38 a signal indicating the occurrence of the difference or the completion of the counting up to the final count value without occurrence of the difference, and ends the counting operation of the timer counter 31.

The end-state determination unit 27 determines whether the updating of the count is ended by the end-of-count determination unit 26 because of the occurrence of the difference between the count of the frequency-divided clock signal and the count of the reference clock signal REF, or because of the completion of the counting up to the final count value without occurrence of the difference between the count of the frequency-divided clock signal and the count of the reference clock signal REF. When the end-state determination unit 27 determines that the updating of the count is ended because of the occurrence of the difference between the count of the frequency-divided clock signal and the count of the reference clock signal REF, the end-state determination unit 27 informs the phase-information addition unit 28 of the determination by the end-state determination unit 27, so that the phase-information addition unit 28 increments the value of the phase information held by the phase information unit 30 by one. On the other hand, when the end-state determination unit 27 determines that the updating of the count is ended because of the completion of the counting up to the final count value without occurrence of the difference between the count of the frequency-divided clock signal and the count of the reference clock signal REF, the end-state determination unit 27 informs the final-phase writing unit 29 of the determination by the end-state determination unit 27, so that the final-phase writing unit 29 writes the value "4" in the phase information unit 30.

In step S12, the end-of-selection determination unit 37 determines whether or not the phase information held in the phase information unit 30 is "3," i.e., whether the phase has changed to "3" or the value "4" is written in the phase information unit 30. When the end-of-selection determination unit 37 determines that the phase has changed to "3," the operation goes to step S13. When the end-of-selection determination unit 37 determines that the phase information is "4," the operation goes to step S17. When the end-of-selection determination unit 37 determines that the phase information is "4," the clock-selection-signal output unit 35 maintains the selection of the VCO.

In step S13, when the comparison unit 24 determines that the frequency of the selected VCO is lower than the frequency of the target VCO, the operation of the clock-selection-signal output unit 35 goes to step S14. When the comparison unit 24 determines that the frequency of the selected VCO is higher than the frequency of the target VCO, the operation of the clock-selection-signal output unit 35 goes to step S15.

In step S14, the clock-selection-signal output unit 35 acquires an amount of change from the shift TB 36 on the basis of the phase information held in the phase information unit 30 and the result of the comparison made by the comparison unit 24. Since the phase information is "3," and the comparison unit 24 determines that the frequency of the selected VCO is lower than the frequency of the target VCO, the code is changed by "+1."

In step S15, the clock-selection-signal output unit 35 acquires an amount of change from the shift TB 36 on the basis of the phase information held in the phase information unit 30 and the result of the comparison made by the comparison unit 24. Since the phase information is "3," and the comparison unit 24 determines that the frequency of the selected VCO is higher than the frequency of the target VCO, the code is changed by "−1."

In step S16, the timer counter 31 in the clock selection circuit 15 starts counting from zero. When the count of the timer counter 31 reaches one of the count values C1 to Cn indicated in the timing TB 32, the timer counter 31 outputs a comparison-instruction signal to the comparison unit 24. At this time, the phase of the clock selection circuit 15 is "3."

Every time the comparison unit 24 receives a comparison-instruction signal from the timer counter 31, the comparison unit 24 determines whether the frequency of the selected VCO is higher or lower than the frequency of the target VCO, and also determines whether or not the frequency of the selected VCO is equal to the frequency of the target clock signal.

When the comparison unit 24 determines that a difference occurs between the count of the frequency-divided clock signal and the count of the reference clock signal REF, or when the count of the timer counter 31 reaches the final count value indicated by the timing TB 32 without occurrence of a difference between the count of the frequency-divided clock signal and the count of the reference clock signal REF, the end-of-count determination unit 26 outputs to the end-state determination unit 27 and the clock-information storing unit 38 a signal indicating the occurrence of the difference or the completion of the counting up to the final count value without occurrence of the difference, and ends the counting operation of the timer counter 31.

The end-state determination unit 27 determines whether the updating of the count is ended by the end-of-count determination unit 26 because of the occurrence of the difference between the count of the frequency-divided clock signal and the count of the reference clock signal REF, or because of the completion of the counting up to the final count value without occurrence of the difference between the count of the frequency-divided clock signal and the count of the reference clock signal REF. When the end-state determination unit 27 determines that the updating of the count is ended because of the occurrence of the difference between the count of the frequency-divided clock signal and the count of the reference clock signal REF, the end-state determination unit 27 informs the phase-information addition unit 28 of the determination by the end-state determination unit 27, so that the phase-information addition unit 28 increments the value of the phase information held by the phase information unit 30 by one, so that the phase information becomes "4." On the other hand, when the end-state determination unit 27 determines that the updating of the count is ended because of the completion of the counting up to the final count value without occurrence of the difference between the count of the frequency-divided clock signal and the count of the reference clock signal REF, the end-state determination unit 27 informs the final-phase writing unit 29 of the determination by the end-state determination unit 27, so that the final-phase writing unit 29 writes the value "4" in the phase information unit 30.

In step S17, since the phase information becomes "4," the end-of-selection determination unit 37 can determine that the sequence for selecting a VCO is completed. Then, the clock-information comparison unit 39 compares one of the count values C1 to Cn which is used for determining the timing of the selection of a VCO in the final phase with another of the count values C1 to Cn which is used for determining the timing of the selection of a VCO in the immediately preceding phase and stored in the clock-information storing unit 38, and determines that the VCO corresponding to the greater count value is to be selected as an optimum VCO. When the clock-information comparison unit 39 determines that the VCO selected in the preceding phase is optimum, the clock-information comparison unit 39 instructs the clock-selection-signal output unit 35 to select the VCO determined to be optimum.

As described above, a plurality of comparison-instruction signals are outputted during an interval in which a difference occurs between the counts of two clock signals having the closest frequencies, and the count of the selected VCO and the count of the target VCO are compared on receipt of each comparison-instruction signal. Therefore, when a difference between the count of the selected VCO and the count of the target VCO occurs during the above interval, the next VCO can be immediately selected, so that it is possible to efficiently select an optimum VCO from among the plurality of VCOs in a short time.

In a conventional clock selection circuit and synthesizer, the comparison of the frequency of the selected VCO and the frequency of the target clock (VCO) is made at regular intervals. Specifically, the comparison is made after a time in which a difference between the counts of VCOs having adjacent frequencies occurs elapses. Therefore, even when the selected VCO is far apart from the target VCO, and a difference between the count of the selected VCO and the count of the target VCO occurs at an early time, the comparison is not immediately made, and the time is uselessly spent before the optimum VCO is selected.

Figure 17:
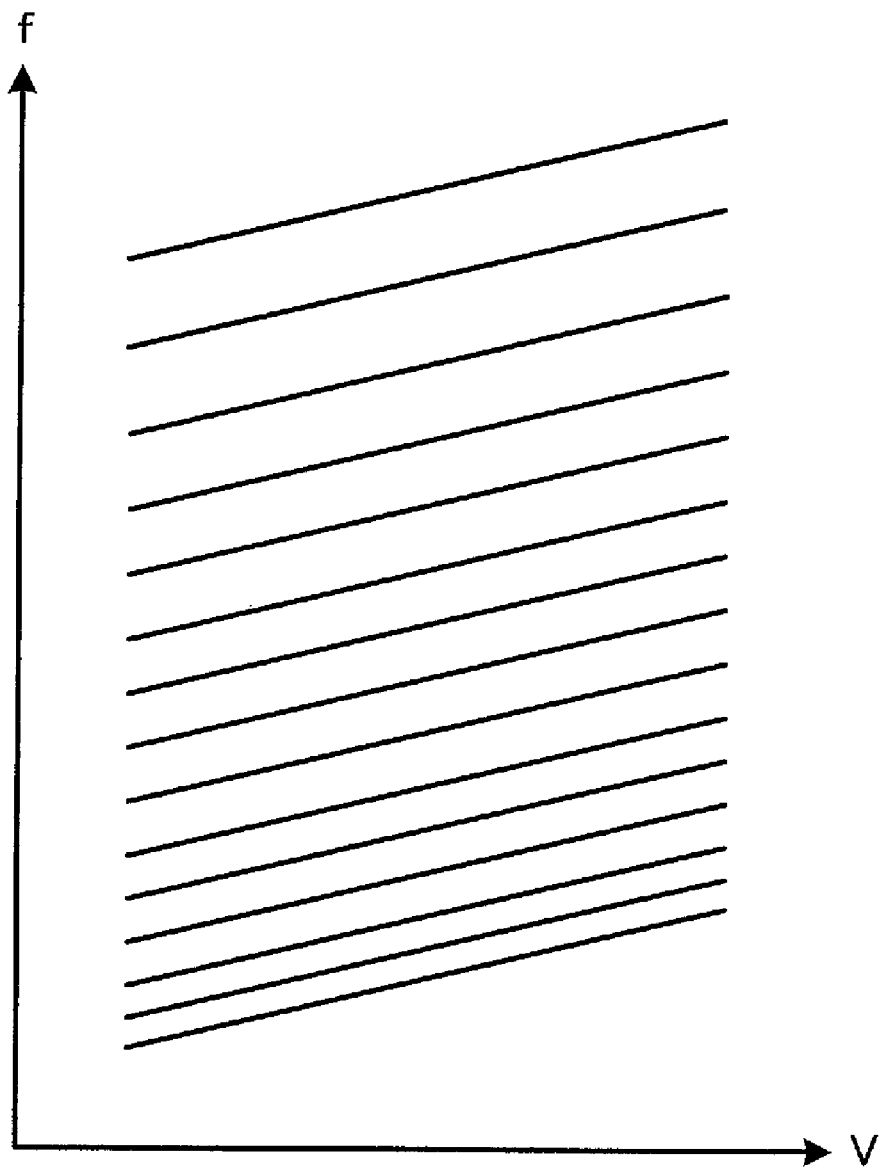
FIG. 17 is a diagram presented for explaining the characteristics of the VCO group.

In addition, in the case where the characteristic lines of the VCOs are not equally spaced as indicated in FIG. 17, the comparison time is required to be set on the basis of the minimum frequency gap. Therefore, even when the selected VCO is far apart from the target VCO, and a difference between the count of the selected VCO and the count of the target VCO occurs at an early time, the comparison is not immediately made, and the time is uselessly spent before the optimum VCO is selected.

The embodiment is made in view of the above problems, and an object of the embodiment is to provide a clock selection circuit and a synthesizer which can select an optimum one from among a plurality of clock signals in a short time.

In order to accomplish the above object, according to the embodiment, a clock selection circuit 1 as illustrated in FIG. 1 is provided. The clock selection circuit 1 according to the present invention is provided for selecting a clock signal from among a plurality of clock signals having different frequencies so that the clock signal has a frequency-divided frequency equal to a frequency of a reference clock signal. The clock selection circuit 1 comprises: a reference-clock counter 1a which counts clock pulses in a reference clock signal and obtains a first count; a clock counter 1b which counts clock pulses in a frequency-divided clock signal which is produced by selecting and frequency-dividing a first one of the plurality of clock signals and obtains a second count; an instruction-signal output unit 1c which outputs a plurality of comparison-instruction signals during an interval in which a difference occurs between a count of clock pulses in a second one of the plurality of clock signals having a first frequency and a count of clock pulses in a third one of the plurality of clock signals having a second frequency, where the first frequency and the second frequency are closest among the different frequencies; a comparison unit 1d which makes a comparison of the first count and the second count; and a selection unit 1e which makes a selection of the clock signal by a binary search according to a result of the comparison.

In the above clock selection circuit 1, a plurality of comparison-instruction signals are outputted during an interval in which a difference between the counts of two clock signals having the closest frequencies occurs, and the count of the reference clock signal and the count of the selected clock signal are compared on receipt of each comparison-instruction signal. Therefore, when a difference between the count of the reference clock signal and the count of the selected clock signal occurs during the above interval, the next clock signal can be immediately selected.

ADVANTAGEOUS EFFECTS

In the above clock selection circuit according to the embodiment, a plurality of comparison-instruction signals are outputted during an interval in which a difference between the counts of two clock signals having the closest frequencies occurs, and the count of the reference clock signal and the count of the selected clock signal are compared on receipt of each comparison-instruction signal. Therefore, when a difference between the count of the reference clock signal and the count of the selected clock signal occurs during the above interval, the next clock signal can be immediately selected, so that it is possible to select an optimum clock signal from among the plurality of clock signals in a short time.

The above and other objects, features and advantages of the embodiment will become apparent from the following description when taken in conjunction with the accompanying drawings which illustrate preferred embodiment of the embodiment by way of example. The foregoing is considered as illustrative only of the principle of the embodiment. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A clock selection circuit for selecting a clock signal from among a plurality of clock signals having different frequencies, comprising:
    a reference-clock counter which counts clock pulses in a reference clock signal and obtains a first count;
    a clock counter which counts clock pulses in a frequency-divided clock signal which is produced by selecting and frequency-dividing one of said plurality of clock signals and obtains a second count;
    a comparison unit which makes a first comparison of said first count and said second count to detect a difference therebetween, each time a comparison instruction signal is received;
    a selection unit which makes a selection of said clock signal as a source of the frequency-divided clock signal, by a binary search according to a result of said first comparison; and
    an instruction-signal output unit which repetitively outputs the comparison-instruction signal to the comparison unit until the difference between said first and second counts reaches a predetermined value, in each phase of the binary search during which the selection unit maintains the selection that has been made.

2. The clock selection circuit according to claim 1, wherein said selection unit selects said clock signal by said binary search when said first count and said second count are different.

3. The clock selection circuit according to claim 1, wherein said selection unit terminates said selection when said first count and said second count are identical.

4. The clock selection circuit according to claim 1, further comprising:
    a clock-information storing unit which stores a first time which elapses until the difference between said first count and said second count reaches the predetermined value in a phase preceding to a current phase of said binary search; and
    a clock-information comparison unit which makes a second comparison of said first time and a second time which elapses until a difference between said first count and said second count reaches said predetermined value in the current phase after completion of said binary search,
    wherein said selection unit selects, as a source of said frequency-divided clock signal, one of clock signals selected in the current phase and the phase preceding to the current phase based on a result of said second comparison.

5. The clock selection circuit according to claim 4, wherein said selection unit selects said one of said clock signals selected in the current phase and the phase preceding to the current phase, corresponding to a longer one of said first time and said second time.

6. The clock selection circuit according to claim 4, wherein the current phase coincides with a final phase of said binary search.

7. The clock selection circuit according to claim 6, wherein the phase is immediately preceding to the current phase.

8. The clock selection circuit according to claim 1, wherein said instruction-signal output unit outputs said plurality of comparison-instruction signals at timings which are determined so that said comparison unit can correctly make said first comparison even when asynchronism between said plurality of clock signals and said reference clock signal causes an error in said first count or said second count.

9. The clock selection circuit according to claim 1, wherein said comparison unit determines that said first count and said second count are identical when a difference between the first count and the second count is within a predetermined range.

10. The clock selection circuit according to claim 1, wherein said frequency-divided clock signal is produced at a frequency-division ratio which can be changed in accordance with an external instruction.

11. A clock selection circuit for selecting a clock signal from among a plurality of clock signals having different frequencies, comprising:
    a reference-clock counter which counts clock pulses in a frequency-divided reference clock signal and obtains a first count;
    a clock counter which counts clock pulses in a selected one of said plurality of clock signals and obtains a second count;
    a comparison unit which makes a comparison of said first count and said second count to detect a difference therebetween, each time a comparison instruction signal is received;
    a selection unit which makes a selection of said clock signal for the clock counter by a binary search according to a result of said comparison; and
    an instruction-signal output unit which repetitively outputs the comparison-instruction signal to the comparison unit until the difference between said first and second counts reaches a predetermined value, in each phase of the binary search during which the selection unit maintains the selection that has been made.

12. A synthesizer for selecting a clock signal from among a plurality of clock signals outputted from a plurality of voltage controlled oscillators, the synthesizer comprising:
    a reference-clock counter which counts clock pulses in a reference clock signal and obtains a first count;
    a clock counter which counts clock pulses in a frequency-divided clock signal which is produced by selecting and frequency-dividing a first one of said plurality of clock signals and obtains a second count;
    a comparison unit which makes a comparison of said first count and said second count to detect a difference therebetween, each time a comparison instruction signal is received;
    a selection unit which makes a selection of said clock signal as a source of the frequency-divided clock signal, by a binary search according to a result of said comparison;
    an instruction-signal output unit which repetitively outputs the comparison-instruction signal to the comparison unit until the difference between said first and second counts reaches a predetermined value, in each phase of the binary search during which the selection unit maintains the selection that has been made; and
    a voltage control unit which controls a voltage controlling one of said plurality of voltage controlled oscillators which outputs said clock signal, according to a phase difference between said frequency-divided clock signal and said reference clock signal.

* * * * *